(12) United States Patent
Oh et al.

(10) Patent No.: US 10,977,120 B2
(45) Date of Patent: Apr. 13, 2021

(54) MEMORY CONTROLLER DETERMINING ENDURANCE DEGRADATION, MEMORY SYSTEM INCLUDING THE SAME, AND METHOD OF OPERATING THE MEMORY CONTROLLER

(71) Applicant: Samsung Electronics Co., Ltd., Suwon-si (KR)

(72) Inventors: Eun Chu Oh, Hwaseong-si (KR); Jeong-ho Lee, Gwacheon-si (KR); Young-jin Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/415,906

(22) Filed: May 17, 2019

(65) Prior Publication Data

US 2020/0159619 A1  May 21, 2020

(30) Foreign Application Priority Data

Nov. 15, 2018  (KR) .......................... 10-2018-0141130

(51) Int. Cl.
*G06F 11/10* (2006.01)
*G11C 13/00* (2006.01)
(Continued)

(52) U.S. Cl.
CPC ...... *G06F 11/1068* (2013.01); *G11C 13/0004* (2013.01); *G11C 13/0035* (2013.01);
(Continued)

(58) Field of Classification Search
CPC ...... G06F 11/10; G06F 11/1068; G06F 12/00; G06F 12/02; G06F 3/06; G11C 13/00;
(Continued)

(56) References Cited

U.S. PATENT DOCUMENTS 8,804,418 B1*  8/2014  Shih ....................... G11C 16/10
365/185.02
8,868,824 B2  10/2014  Sankar et al.
(Continued)

FOREIGN PATENT DOCUMENTS

KR  10-2018-0038725 A  4/2018

OTHER PUBLICATIONS

Goux et al., "Degradation of the Reset Switching During Endurance Testing of a Phase-Change Line Cell" IEEE Transactions on electron devices, vol. 56, No. 2, Feb. 2009.

*Primary Examiner* — Albert Decady
*Assistant Examiner* — Enamul M Kabir
(74) *Attorney, Agent, or Firm* — Muir Patent Law, PLLC

(57) ABSTRACT

Provided are a memory controller determining degradation in endurance, a memory system including the memory controller, and a method of operating the memory controller. The memory controller includes: an error correction code (ECC) circuit configured to detect an error from data read from a memory device; and an endurance determination circuit configured to check a first counting value indicating a number of writing operations on the memory device and a second counting value indicating, based on the data read from the memory device, at least one of: a number of first memory cells of the memory device, each of the first memory cells having an error and a number of second memory cells of the memory device in a certain logic state, and configured to perform a first determination operation for determining whether endurance of the memory device has degraded based on a checking result.

18 Claims, 22 Drawing Sheets

(51) Int. Cl.
  *G11C 29/52* (2006.01)
  *H01L 45/00* (2006.01)
(52) U.S. Cl.
  CPC .......... *G11C 13/0069* (2013.01); *G11C 29/52* (2013.01); *G11C 2213/72* (2013.01); *H01L 45/06* (2013.01); *H01L 45/144* (2013.01)
(58) Field of Classification Search
  CPC ............ G11C 13/0004; G11C 13/0035; G11C 13/0069; G11C 16/04; G11C 16/34; G11C 29/00; G11C 29/52; H01L 45/00; H01L 45/06; H01L 45/144
  See application file for complete search history.

(56) References Cited

U.S. PATENT DOCUMENTS

| | | |
|---|---|---|
| 9,141,536 B2 | 9/2015 | Faber |
| 9,324,420 B2 | 4/2016 | Shin et al. |
| 9,329,948 B2 | 5/2016 | Li et al. |
| 9,430,322 B2 | 8/2016 | Wolfman et al. |
| 9,594,673 B2 | 3/2017 | Kim et al. |
| 9,857,986 B2 | 1/2018 | Fisher et al. |
| 10,042,754 B2 * | 8/2018 | Moon .................. G06F 12/0246 |
| 10,540,099 B2 * | 1/2020 | Harrand ................ G06F 3/0616 |
| 2003/0043538 A1 * | 3/2003 | Iwanari ................ G11C 29/028 361/679.31 |
| 2009/0157952 A1 * | 6/2009 | Kim ................... G11C 13/0004 711/103 |
| 2014/0082459 A1 * | 3/2014 | Li .......................... G11C 29/52 714/773 |
| 2015/0135025 A1 * | 5/2015 | Kim ................... G06F 12/0246 714/704 |
| 2016/0034327 A1 * | 2/2016 | Kim ...................... G11C 16/10 714/37 |
| 2016/0055917 A1 * | 2/2016 | Lee .................... G11C 16/0483 365/185.11 |
| 2017/0024137 A1 * | 1/2017 | Kanno .................. G06F 3/0644 |
| 2017/0300252 A1 * | 10/2017 | Yim ....................... G11C 29/52 |
| 2018/0067697 A1 * | 3/2018 | Lee ....................... G06F 3/0656 |
| 2018/0143762 A1 * | 5/2018 | Kim ...................... G06F 11/008 |
| 2018/0173432 A1 * | 6/2018 | Han ..................... G11C 11/5642 |
| 2018/0294036 A1 * | 10/2018 | Oh ...................... G11C 11/5628 |
| 2019/0108119 A1 * | 4/2019 | Gholamipour ....... G11C 16/349 |
| 2019/0129655 A1 * | 5/2019 | Lee ..................... G11C 16/3413 |
| 2019/0214091 A1 * | 7/2019 | Lee ........................ G11C 29/42 |

* cited by examiner

MEMORY CONTROLLER DETERMINING ENDURANCE DEGRADATION, MEMORY SYSTEM INCLUDING THE SAME, AND METHOD OF OPERATING THE MEMORY CONTROLLER

CROSS-REFERENCE TO RELATED APPLICATION

This application claims the benefit of Korean Patent Application No. 10-2018-0141130, filed on Nov. 15, 2018, in the Korean Intellectual Property Office, the disclosure of which is incorporated herein in its entirety by reference.

BACKGROUND

The inventive concept relates to a memory controller, and more particularly, to a memory controller capable of determining degradation in endurance, a memory system including the memory controller, and a method of operating the memory controller.

As non-volatile memory devices, resistive memories such as phase change random access memory (PRAM), nano-floating gate memory (NFGM), polymer RAM (PoRAM), magnetic RAM (MRAM), ferroelectric RAM (FeRAM), resistive RAM (RRAM), etc. are well known in the art in addition to flash memories. A resistive memory has a non-volatile characteristic of a flash memory, as well as a high-speed property of dynamic RAM (DRAM).

A resistive memory may reach the end of the lifespan thereof when writing and/or reading cycles increase, and then data may not be written any more in the resistive memory or data stored in the resistive memory may be lost, thereby degrading reliability. Because there is a risk that data is suddenly lost when the endurance of a resistive memory degrades as the writing and/or reading cycles increase even though appropriate reliability has been maintained, there is a need to exactly determine whether the endurance degrades or not.

SUMMARY

The inventive concept provides a memory controller capable of preventing degradation in reliability of data due to degradation in endurance, a memory system including the memory controller, and a method of operating the memory controller.

According to an aspect of the inventive concept, there is provided a memory controller that controls a memory operation on a memory device, the memory controller including: an error correction code (ECC) circuit configured to detect an error from data read from the memory device; and an endurance determination circuit configured to check a first counting value indicating a number of writing operations on the memory device and a second counting value indicating, based on the data read from the memory device, at least one of: a number of first memory cells of the memory device, each of the first memory cells having an error, and a number of second memory cells of the memory device in a certain logic state and configured to perform a first determination operation for determining whether endurance of the memory device has degraded based on a checking result.

According to another aspect of the inventive concept, there is provided a memory system including: a memory device including a plurality of cell blocks, each cell block including a plurality of pages, and each page including a plurality of memory cells; and a memory controller configured to: control a memory operation on the memory device, and perform a first counting operation for counting a number of writing operations on a first cell block of the plurality of cell blocks, a second counting operation for counting at least one of a number of error cells in a first page of the first cell block and a number of cells in a first logic state in the first page, and a first determination operation for determining whether endurance of the first page has degraded based on results of the first counting operation and the second counting operation.

According to another aspect of the inventive concept, there is provided a method of operating a memory controller that controls a memory operation on a memory device, the method including: performing a first counting indicating a number of times of accessing a first page of the memory device or a first cell block including the first page; performing a second counting indicating a number of error cells or a number of off-cells from among memory cells of the first page, based on a result of reading data from the first page; performing a first determination about whether endurance of the first page has degraded based on results of the first counting and the second counting; re-writing data in the first page by using a writing current of a level that is lower than a level of a normal writing current, in response to a result of the first determination on the first page having degraded endurance; performing a second determination about whether the endurance of the first page has degraded by using the data re-written in the first page; and performing a wear-leveling process on the first page in response to a result of the second determination on the first page having degraded endurance.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to accompanying drawings.

Figure 1:
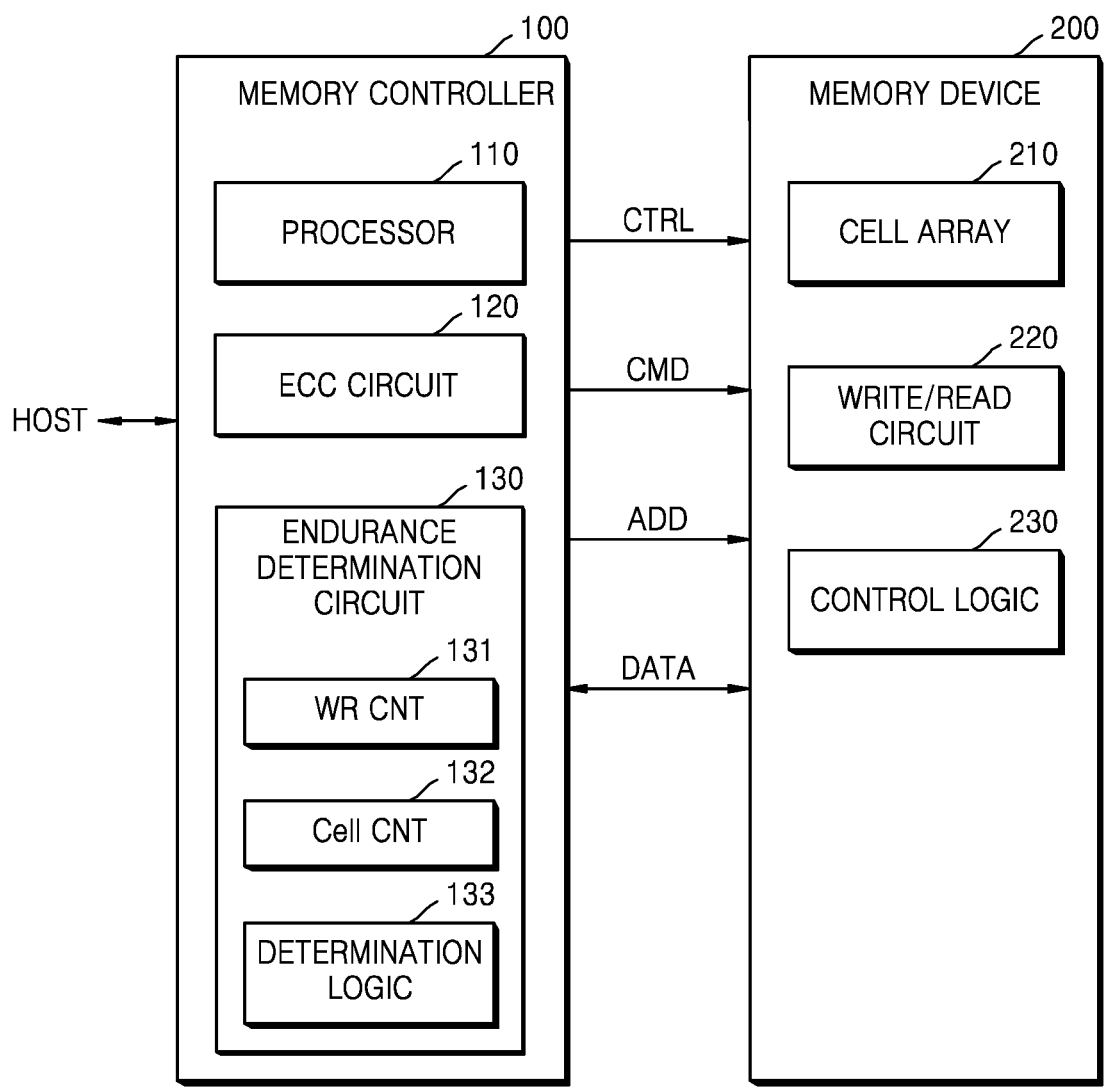
FIG. 1 is a block diagram of a memory system including a memory controller according to example embodiments.

FIG. 1 is a block diagram of a memory system 10 including a memory controller 100 according to example embodiments. In one or more embodiments, a memory device 200 may be referred to as a resistive memory device because resistive memory cells are included therein. Alternatively, in one or more embodiments, the memory device 200 may include various kinds of memory cells. Because the memory cells are arranged on regions where a plurality of first signal lines and a plurality of second signal lines intersect each other, the memory device 200 may be referred to as a cross-point memory device. Although the memory device 200 is assumed to be a resistive memory device in example embodiments below, the embodiments may be applied to various kinds of memory devices, the endurance of which may degrade when writing and/or reading cycles (i.e., a number of writing operations and/or reading operations) increase. As an example, the embodiments may be applied to various kinds of memory devices, e.g., a volatile memory device, a flash memory device, etc.

In FIG. 1, the memory device 200 may be implemented in various types. As an example, the memory device 200 may be a device including one memory chip. Otherwise, the memory device 200 may be defined as a device including a plurality of memory chips; for example, the memory device 200 may be a memory module in which a plurality of memory chips are mounted on a board. However, the invention is not limited to the above example, for example, the memory device 200 may be implemented as various types, e.g., a semiconductor package including one or more memory dies.

Referring to FIG. 1, the memory system 10 may include the memory controller 100 and the memory device 200. The memory device 200 may include a memory cell array 210, a writing/reading circuit 220, and a control logic 230. In addition, the memory controller 100 may include a processor 110, an error correction code (ECC) circuit 120, and an endurance determination circuit 130, and the memory controller 100 may control a memory operation in a way based on hardware, software, and combination thereof, according to a control of the processor 110.

The memory controller 100 may read data stored in the memory device 200 in response to a read request from a host, or control the memory device 200 to write data in the memory device 200 in response to a write request from the host. In detail, the memory controller 100 may provide an address ADD, a command CMD, and a control signal CTRL to the memory device 200 to control programming (or writing) and reading operations on the memory device 200. In some examples, the memory controller 100 may provide an address ADD, a command CMD, and a control signal CTRL to the memory device 200 to control an erasing operation on the memory device 200. In an erasing operation, the memory controller 100 may control the memory device 200 to write all data as "1" or as "0" in the memory device 200. In addition, data DATA to be written and read data DATA may be exchanged between the memory controller 100 and the memory device 200.

The processor 110 may control overall operations of the memory controller 100. The memory controller 100 may communicate with the host via various protocols, for example, may be configured to communicate with outside (HOST) via at least one of various interface protocols, e.g., universal serial bus (USB), multi-media card (MMC), peripheral component interconnect-express (PCI-E), advanced technology attachment (ATA), serial-ATA, parallel-ATA, small computer system interface (SCSI), enhanced small device interface (ESDI), integrated drive electronic (IDE), etc.

The memory cell array 210 may include a plurality of memory cells (not shown) respectively arranged on regions where a plurality of first signal lines and a plurality of second signal lines intersect each other. In one embodiment, the plurality of first signal lines may be a plurality of bit lines and a plurality of second signal lines may be a plurality of word lines. In addition, each of the plurality of memory cells may be a single level cell (SLC) storing one bit or a multi-level cell (MLC) storing data of two bits or greater. The plurality of memory cells may have a plurality of resistance distributions according to the number of bits stored in each memory cell. For example, when data of one bit is written in one memory cell, the memory cells may have two resistance distributions, and when data of two bits is stored in one memory cell, the memory cells may have four resistance distributions.

The memory cell array 210 may include resistive memory cells including a variable resistance device (not shown). For example, when the variable resistance device includes a phase change material (GST, Ge—Sb—Te) whose resistance is changed according to a temperature, the resistive memory device may be PRAM. As another example, when the variable resistance device includes an upper electrode, a lower electrode, and a complex metal oxide between the upper and lower electrodes, the resistive memory device may be RRAM. As another example, when the variable resistance device includes an upper electrode of a magnetic material, a lower electrode of a magnetic material, and a dielectric material between the upper and lower electrodes, the resistive memory device may be MRAM.

The memory controller 100 may include the ECC circuit 120 that detects and corrects an error in the data DATA read from the memory device 200 and may provide the host with the data DATA, an error of which is corrected. According to an embodiment, the ECC circuit 120 may perform an ECC encoding process by using data from the host and may perform an ECC decoding process by using the data read from the memory device 200. Also, the number of errors that occur in the data read from a predetermined region (e.g., a page, a word line, a cell block, etc.) of the memory cell array 210 may be detected based on a result of detecting errors from the ECC circuit 120.

According to the embodiment, the endurance determination circuit 130 may predict or determine whether the endurance degrades as the lifespan of the memory device 200 is running out (or as writing, erasing and/or reading cycles increase). For example, the endurance determination circuit 130 may determine the endurance based on various units of the memory cell array 210, and as an example, the endurance determination circuit 130 may determine the endurance in units of pages, word lines, cell blocks, etc. of the memory cell array 210. According to the embodiment, the endurance determination circuit 130 may determine the endurance of the memory device 200 by using various methods; for example, the endurance determination circuit 130 may determine whether the endurance of the memory device 200 has degraded according to various kinds of counting results and various kinds of criteria. Hereinafter, an example in which the endurance determination circuit 130 determines the endurance in units of pages will be described below, but the endurance may be determined in other various units.

As an example, the endurance determination circuit 130 may include a write counter 131, a cell counter 132, and a determination logic 133 as various elements used to determine the endurance. The write counter 131 may count the number of write times of various memory operations on the memory device 200 and may perform a counting operation in units of various regions in the memory cell array 210. The write counter 131 of FIG. 1 may include a plurality of counters for counting the number of various memory operations and performing counting operations on various regions.

As an example, with respect to a first cell block included in the memory cell array 210, the first cell block may include a plurality of pages and the endurance determination circuit 130 may perform a counting operation for determining endurance in units of pages. For example, when determining endurance of a first page included in the first cell block, the write counter 131 may count the number of writing operations on the first cell block and output a counted value and may count the number of writing operations on the first page and output a counted value.

The cell counter 132 may perform a cell counting operation on the data read from the memory cell array 210. As an example, the cell counter 132 may include a counter for counting the number of errors that occur in the data read from the first page of the first cell block. In addition, the cell counter 132 may include a counter for counting the number of off-cells (or on-cells) of the first page, by counting data in a predetermined logic state from the data read from the first page of the first cell block. The cell counter 132 may output a result of error counting and/or a result of off-cell counting.

The determination logic 133 may determine whether the endurance of the first page has degraded, based on the counting results of the write counter 131 and the cell counter 132. As an example, the endurance of the memory cell array 210 may degrade as the writing and reading cycles increase, and the determination logic 133 may determine that the endurance of the first page has degraded when the number of writing operations on the first cell block including the first page exceeds a predetermined first reference value and at the same time the number of writing operations on the first page exceeds a predetermined second reference value. Also, when the endurance of the first page degrades, a resistance distribution characteristic of the memory cells may degrade, for example, resistance distributions of the memory cells may be shifted in a direction or a width of each resistance distribution may increase. The determination logic 133 may determine that the endurance of the first page degrades when the number of error cells exceeds a predetermined third reference value or the number of off-cells (or on-cells) exceeds a predetermined fourth reference value according to the error counting result and/or off-cell counting result.

The determination logic 133 may determine whether the endurance of the first page degrades based on various determination criteria. For example, the above four counting results may be variously combined to include at least two counting results, and the degradation in the endurance may be determined according to the above combinations. As an example, whether the endurance of the first page degrades may be determined by determining the number of error cells or the number of off-cells in the data read from the first page, together with the number of writing operations on the first cell block. As another example, whether the endurance of the first page degrades may be determined by determining the number of error cells or the number of off-cells in the data read from the first page, together with the number of writing operations on the first page.

When it is determined that the endurance of the first page has degraded, the memory controller 100 may perform a wear-leveling process on the memory cell array 210 to ensure reliability of the data. As an example, the wear-leveling process may be performed by various methods, e.g., data swap, data copying, etc. The wear-leveling process may be performed, for example, in units of cell blocks or pages. In example embodiments, the data of the first page having degraded endurance may be copied to another page based on the wear-leveling process performed in units of pages. In example embodiments, the data of the first cell block including the first page may be copied to another cell block according to the wear-leveling process performed in units of cell blocks. In example embodiments, the data of the first page may be copied to another page in the first cell block or a page in another cell block according to the wear-leveling process performed in units of pages.

In example embodiments, when the data of the first page are degraded an address of the first page may be swapped with an address of a second page in the wear-leveling process.

In example embodiments, when the data of the first page included in the first cell block are degraded an address of the first cell block may be swapped with an address of a second block in the wear-leveling process.

The number of writing operations may be counted in units of pages according to the embodiment illustrated in FIG. 1, but the invention is not limited thereto. As an example, the cell block may include a plurality of word lines, each word line including memory cells configuring a plurality of pages, and the number of writing operations on a first word line connected to the first page may be counted when determining the endurance of the first page.

Also, in the embodiment illustrated with reference to FIG. 1, it is described that the number of writing operations on the cell block and the page (or word line) is counted in determining the endurance, but the invention is not limited thereto. As an example, the memory cell array 210 may include a resistive memory with respect to which writing, erasing and reading operations may be performed in units of pages, and the above operation of determining the endurance may be performed by counting the number of writing or erasing operations on the cell block and the page (or word line).

In addition, in the example embodiments illustrated with reference to FIG. 1, the endurance determination circuit 130 includes various counters, but the memory controller 100 may be implemented in various types. As an example, a counter for counting error cells in the cell counter 132 may be provided in the ECC circuit 120 and the ECC circuit 120 may provide the endurance determination circuit 130 with a result of counting the error cells. Alternatively, the memory system 10 may be configured so that at least some of various counters provided in the endurance determination circuit 130 may be provided in the memory device 200 and the memory device 200 provides the memory controller 100 with the counting result.

In the above embodiments, it is described that whether the endurance of the page has degraded is determined, but terms may be variously defined. As an example, according to the determination of the embodiments, a result indicating that endurance failure occurs in the page may be output.

The memory controller 100 and the memory device 200 may be provided as separate semiconductor devices. Otherwise, the memory controller 100 and the memory device 200 may be integrated as one semiconductor device. For example, the memory controller 100 and the memory device 200 may be integrated as one semiconductor device to configure a memory card. For example, the memory controller 100 and the memory device 200 may be integrated as one semiconductor device and may configure a PC card such as a personal computer memory card international association (PCMCIA) card, a compact flash (CF) card, a smart media card (SM/SMC), a memory stick, a multi-media card, e.g., MMC, RS-MMC, or MMCmicro, an SD card, e.g., SD, miniSD, or microSD, a universal flash storage (UFS) device, etc.

Figure 2:
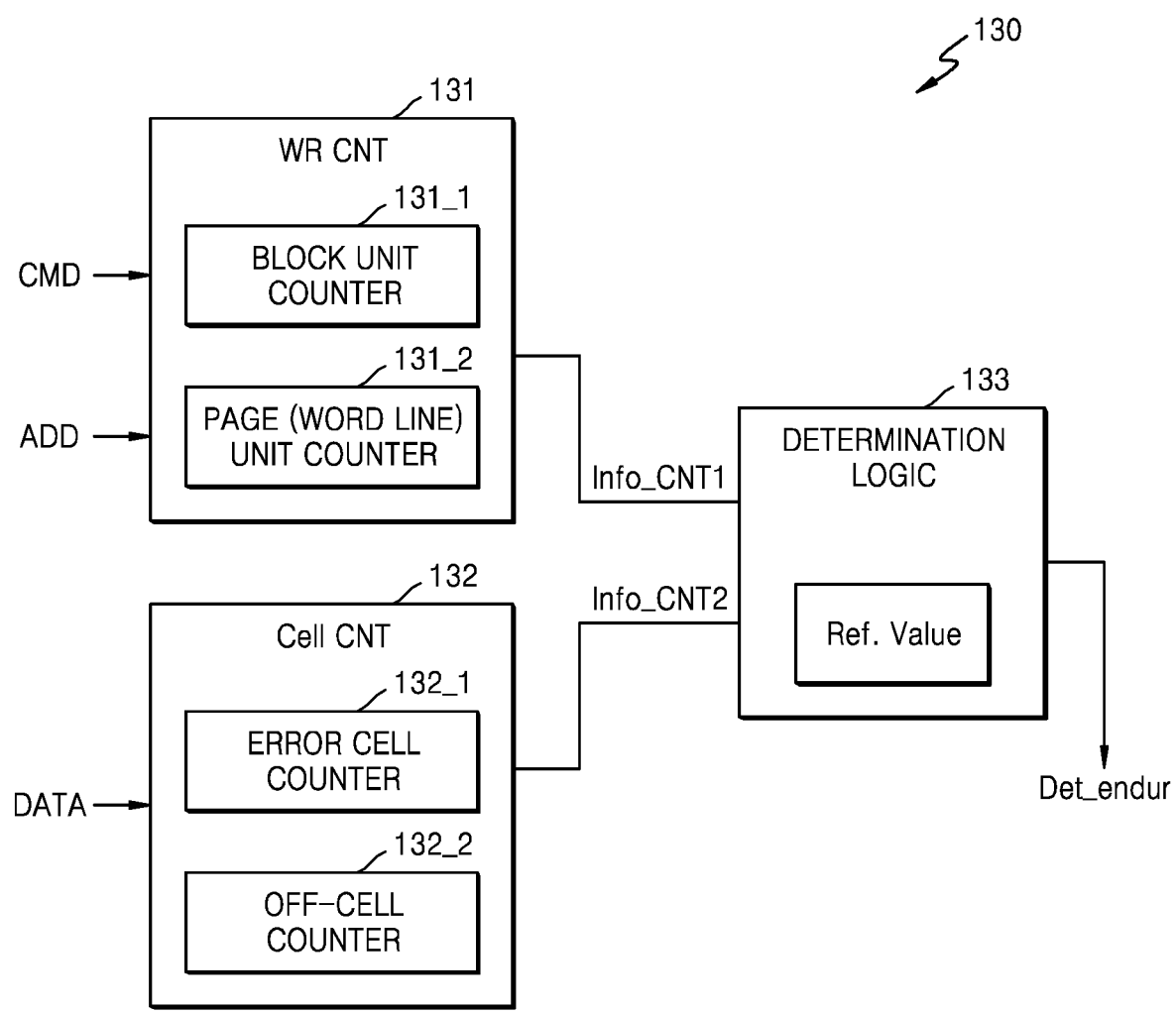
FIG. 2 is a block diagram illustrating an implemented example of an endurance determination circuit of FIG. 1 according to example embodiments.

FIG. 2 is a block diagram illustrating an implemented example of the endurance determination circuit 130 of FIG. 1 according to example embodiments. In one or more embodiments below, an example in which the number of writing operations is counted for determining the endurance and the number of writing operations is counted in units of pages will be described, but the counting may be performed in units of word lines or the number of reading operations may be counted according to one or more embodiments. Also, an example in which an operation of counting the number of off-cells in read data will be provided as an example of the cell counting operation, but the endurance may be determined by counting the number of on-cells.

Referring to FIGS. 1 and 2, the endurance determination circuit 130 includes the write counter 131 and the cell counter 132, and the write counter 131 may include a block unit counter 131_1 and a page unit counter 131_2. The cell counter 132 may include an error cell counter 132_1 and an off-cell counter 132_2 (or, on-cell counter). Also, the endurance determination circuit 130 may further include the determination logic 133. The determination logic 133 may receive first counting information Info_CNT1 from the write counter 131 and second counting information Info_CNT2 from the cell counter 132 and may output determination information Det_endur indicating a result of determining the endurance obtained by processing the received information.

The block unit counter 131_1 and the page unit counter 131_2 may respectively include a plurality of counters for counting the number of writing operations on corresponding regions. As an example, the memory cell array 210 may include a plurality of cell blocks and the block unit counter 131_1 may include a plurality of counters corresponding to the plurality of cell blocks. Each of the cell blocks includes a plurality of pages, and the page unit counter 131_2 may include a plurality of counters respectively corresponding to the plurality of pages.

The memory controller 100 may receive a command CMD and an address ADD for memory operation through communication with the host, and the write counter 131 may perform the counting operation based on the command CMD and the address ADD. As an example, the write counter 131 may perform the counting operation based on the command CMD requesting data writing and the block unit counter 131_1 and the page unit counter 131_2 may count the number of writing operations on a cell block or a page indicated by the address ADD.

The cell counter 132 may receive data DATA read from a predetermined unit (e.g., page) on which the determination of endurance is performed and may perform the cell counting operation using the data DATA. For example, the error cell counter 132_1 may count the number of memory cells detected through an error detection operation on data of a predetermined unit, and the off-cell counter 132_2 may determine the number of off-cells from the data DATA having a predetermined logic state (e.g., logic 0 or logic 1) from the read data DATA. According to the embodiment, the error cell counter 132_1 may generate a counting result by counting the error detection result of the ECC circuit 120. As an example, the error cell counter 132_1 may be included in the ECC circuit 120 and an error cell counting result from the ECC circuit 120 may be provided to the endurance determination circuit 130.

A variation in a width of resistance distribution of the memory cells may be predicted by determining the number of error cells, and a degree of shifting the resistance distribution of the memory cells may be predicted by determining the number of off-cells. For example, it may be determined whether the writing operations exceeding a reference number are performed on the page that is a target of endurance determination based on the counting operation of the number of writing operations, and it may be finally determined whether the endurance of the page degrades by determining resistance distribution characteristic of the memory cells in the page.

Figure 3A:
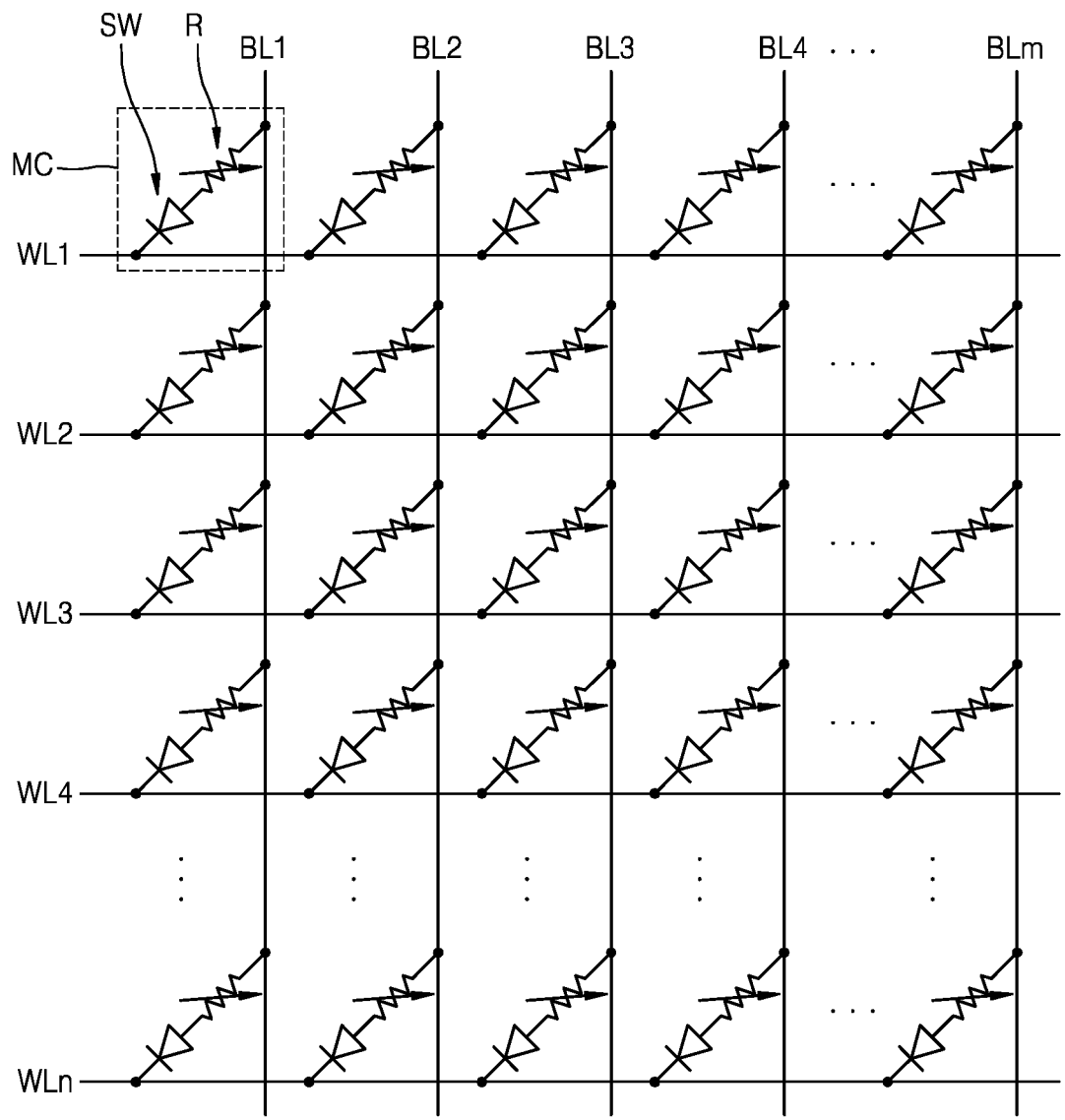
FIGS. 3A and 3B are circuit diagrams showing examples of a memory cell array of FIG. 1.
Figure 3B:
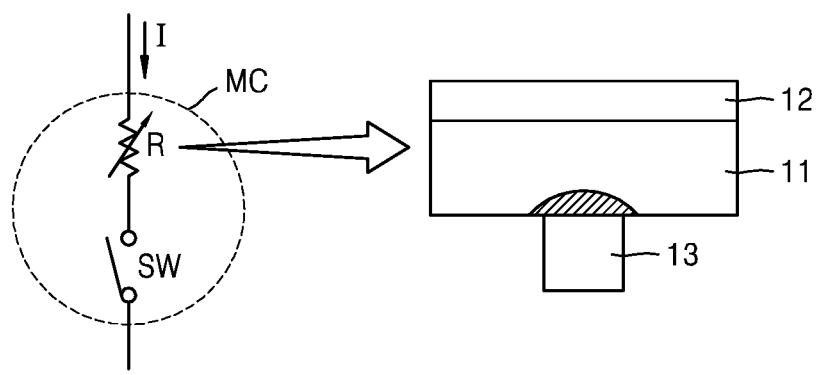

FIGS. 3A and 3B are circuit diagrams showing examples of the memory cell array 210 of FIG. 1. FIGS. 3A and 3B show an example in which the resistive memory cell is PRAM and show one cell block in the memory cell array 210.

The memory cell array 210 may be a two-dimensional memory cell array having a horizontal structure and may include a plurality of word lines WL1 to WLn, a plurality of bit lines BL1 to BLm, and a plurality of memory cells MC. The number of word lines WL, the number of bit lines BL, and the number of memory cells MC may vary depending on embodiments. However, the invention is not limited thereto, for example, in another embodiment, the memory cell array 210 may be a three-dimensional (3D) memory cell array having a vertical structure.

According to example embodiments, each of the plurality of memory cells MC may include a variable resistance device R and a switching device SW. The variable resistance device R may be referred to as a variable resistance material, and the switching device SW may be referred to as a selection device.

In one embodiment, the variable resistance device R may be connected between one of the plurality of bit lines BL1 to BLm and the switching device SW, and the switching device SW may be connected between the variable resistance device R and one of the plurality of word lines WL1 to WLn. However, the invention is not limited thereto, for example, the switching device SW may be connected between one of the plurality of bit lines BL1 to BLm and the variable resistance device R and the variable resistance device R may be connected between the switching device SW and one of the plurality of word lines WL1 to WLn.

The switching device SW may be connected between one of the plurality of word lines WL1 to WLn and the variable resistance device R and may control supply of electric current to the variable resistance device R according to a voltage applied to the connected word line and the bit line. In FIG. 3A, the switching device SW is shown as a diode, but the invention is not limited thereto, for example, according to another embodiment, the switching device SW may include another device capable of switching.

Referring to FIG. 3B, the memory cell MC may include the variable resistance device R and the switching device SW. The switching device SW may include various devices such as a transistor, a diode, etc. The variable resistance device R may include a phase-change layer 11 including a mixture of germanium, antimony, and tellurium (GST, Ge—Sb—Te), an upper electrode 12 on the phase-change layer 11, and a lower electrode 13 under the phase-change layer 11.

The upper and lower electrodes 12 and 13 may include various metal, metal oxide, or metal nitride. The phase-change layer 11 may include a bipolar resistance memory material or unipolar resistance memory material. The bipolar resistance memory material is programmed to a set state or a reset state according to a polarity of an applied electric current and may include Perovskite-based materials. The unipolar resistance memory material is programmed to a set state or a reset state by an electric current having the same polarity and may include transition metal oxide such as NiOx or TiOx.

In FIG. 3B, when a writing current I is applied to the memory cell MC, the writing current I flows through the lower electrode 13. When the writing current I is applied to the memory cell MC for a very short period of time, the applied writing current I adjacent to the lower electrode 13 is only heated by Joule's heat. Here, due to a variation in a heating profile, the phase-change layer 11 may be partially in a crystallized state (or set state) or a non-crystalline state (or reset state).

Figure 4:
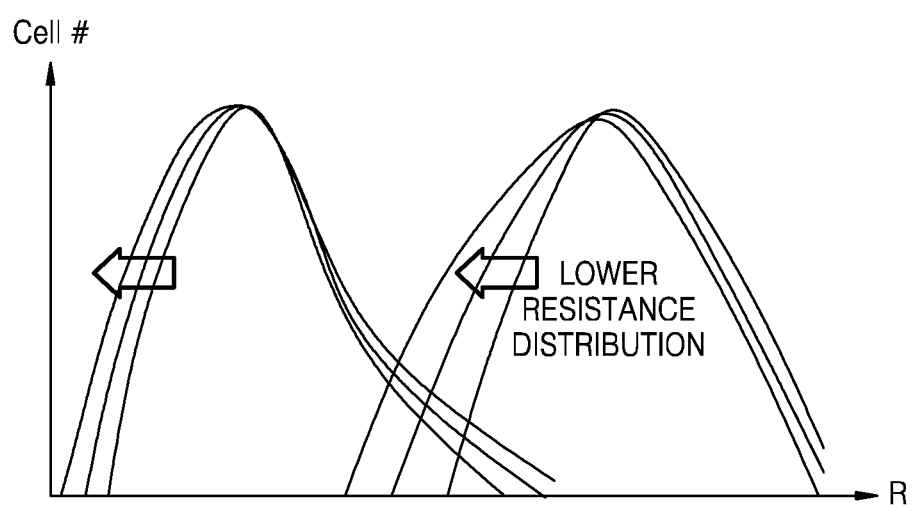
FIG. 4 is a diagram showing an example of resistance distribution of memory cells having degraded endurance.

FIG. 4 is a diagram showing an example of resistance distribution of memory cells having degraded endurance. In FIG. 4, the transverse axis denotes a resistance level and the longitudinal axis denotes the number of memory cells, and an example of a variation in the resistance distribution according to increase in the writing cycles is shown.

Referring to FIG. 4, data is written in a page including a plurality of memory cells and the resistance distribution of the memory cells may be switched to a state degrading reliability of data according to the increase in the writing cycles. For example, the plurality of memory cells may be programmed to a set state having a relatively small resistance level and a reset state having a relatively large resistance level. As the writing cycles increase, the resistance distribution of the memory cells may be shifted in a direction (for example, a direction of reducing the resistance level) and a width of the resistance distribution in the set state and a width of the resistance distribution in the reset state may be respectively increased. According to the embodiment, it is determined whether the resistance distribution of the memory cells in the region that is a target, the endurance of which is determined, has the resistance distribution caused by the endurance degradation as shown in FIG. 4, and accordingly whether the endurance of the region has degraded may be accurately determined.

As an example, a variation in the width of the resistance distributions in the set state and the reset state may be predicted based on the error cell counting operation in the above embodiments, and when the number of error cells exceeds a predetermined reference value, it may be determined that the error cells are generated due to the degradation in the endurance. Also, the shift degree of the resistance distributions in the set state and the reset state may be predicted based on the off-cell counting operation, and when the number of off-cells (or the number of cells determined as the set state) exceeds a predetermined reference value, it may be determined that the resistance distribution of the memory cells is shifted due to the degradation in the endurance. For example, according to the example embodiments, the accuracy in determining whether the endurance of the memory cell array degrades may be improved based on various combinations of the result of counting the number of writing operations and the cell counting results.

Figure 5:
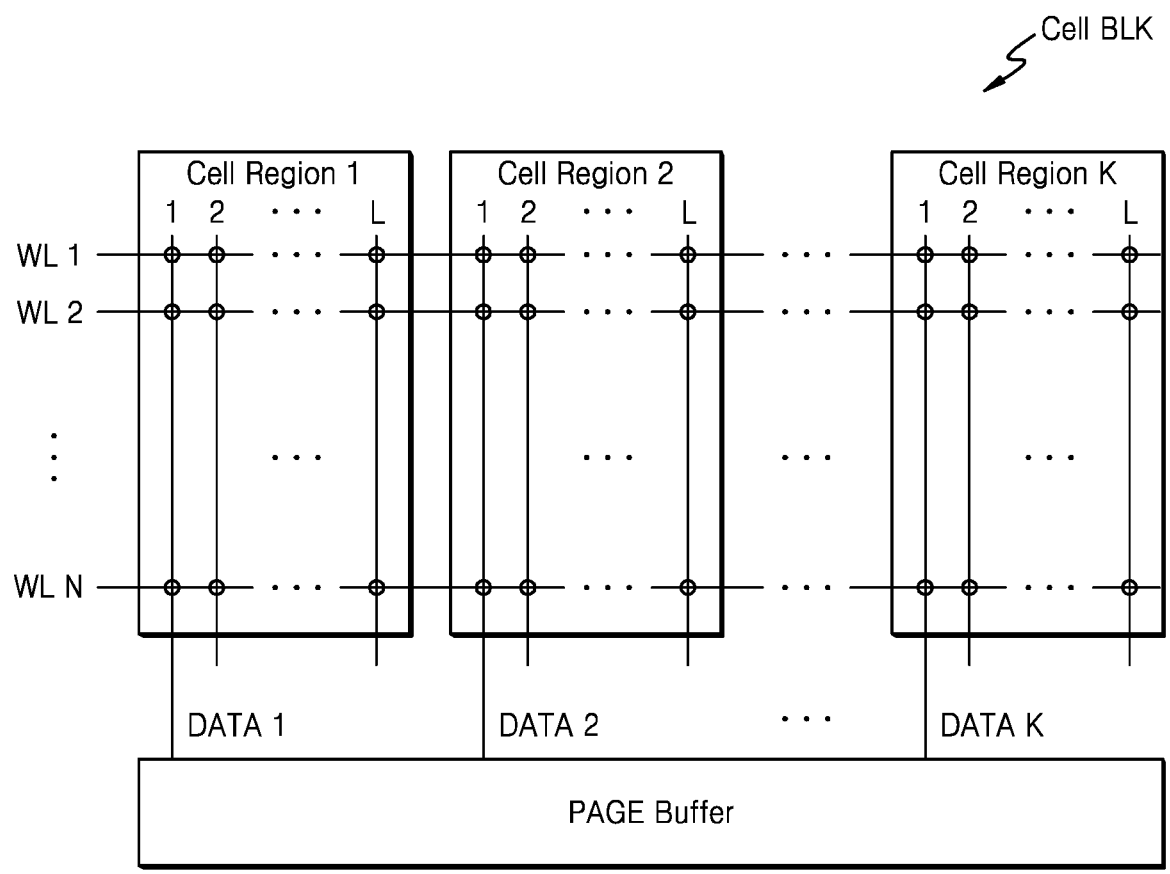
FIG. 5 is a diagram illustrating an example in which a write counting in units of pages and a write counting in units of word lines are applied.

FIG. 5 is a diagram illustrating an example in which a write counting in units of pages and a write counting in units of word lines are applied.

Referring to FIG. 5, the memory cell array includes a plurality of cell blocks, each cell block including a plurality of word lines WL1 to WLN. Also, a plurality of memory cells may be connected to each of the plurality of word lines WL1 to WLN.

Each of the cell blocks may include a plurality of cell regions Cell Region 1 to Cell Region K. As an example, assuming that the data is written or read in units of predetermined pages, the page may be a unit including one memory cell in each of the cell regions Cell Region 1 to Cell Region K. For example, the data of one page unit read from the cell block may include K pieces of data DATA 1 to DATA K read from the cell regions Cell Region 1 to Cell Region K.

According to example embodiments, the counting operation for determining the endurance may be performed in units of word lines or in units of pages. As an example, when the counting operation is performed in units of word lines, N counters may be provided respectively corresponding to N word lines WL1 to WLN. Otherwise, assuming one word line includes L pages, L counters may be provided with respect to one word line when the counting operation is performed in units of pages.

Assuming that the endurance of a first page included in a first word line WL1 in the cell block is determined, in a case where it is determined that the endurance of the first page degrades according to the above embodiments, a wear-leveling operation may be performed in various processing units. As an example, the wear-leveling may be performed in units of pages, in units of word lines including the first page, or in units of cell blocks including the first page.

Figure 6:
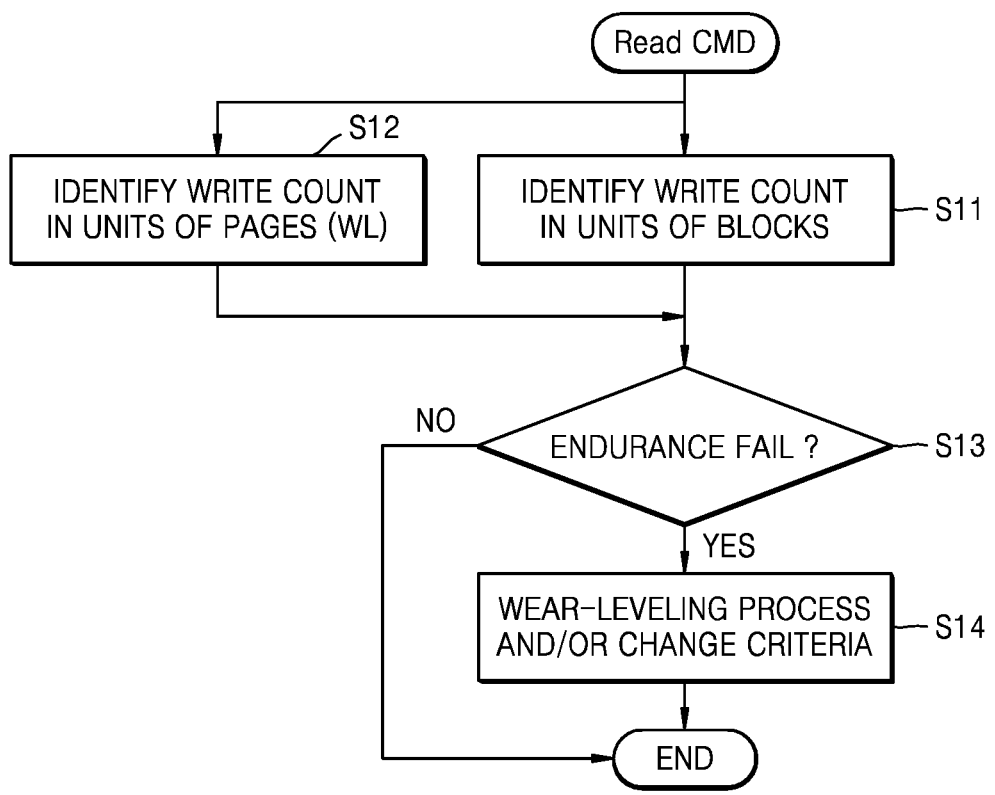
FIGS. 6, 7, 8A, and 8B are diagrams illustrating methods of determining endurance, according to example embodiments.
Figure 7:
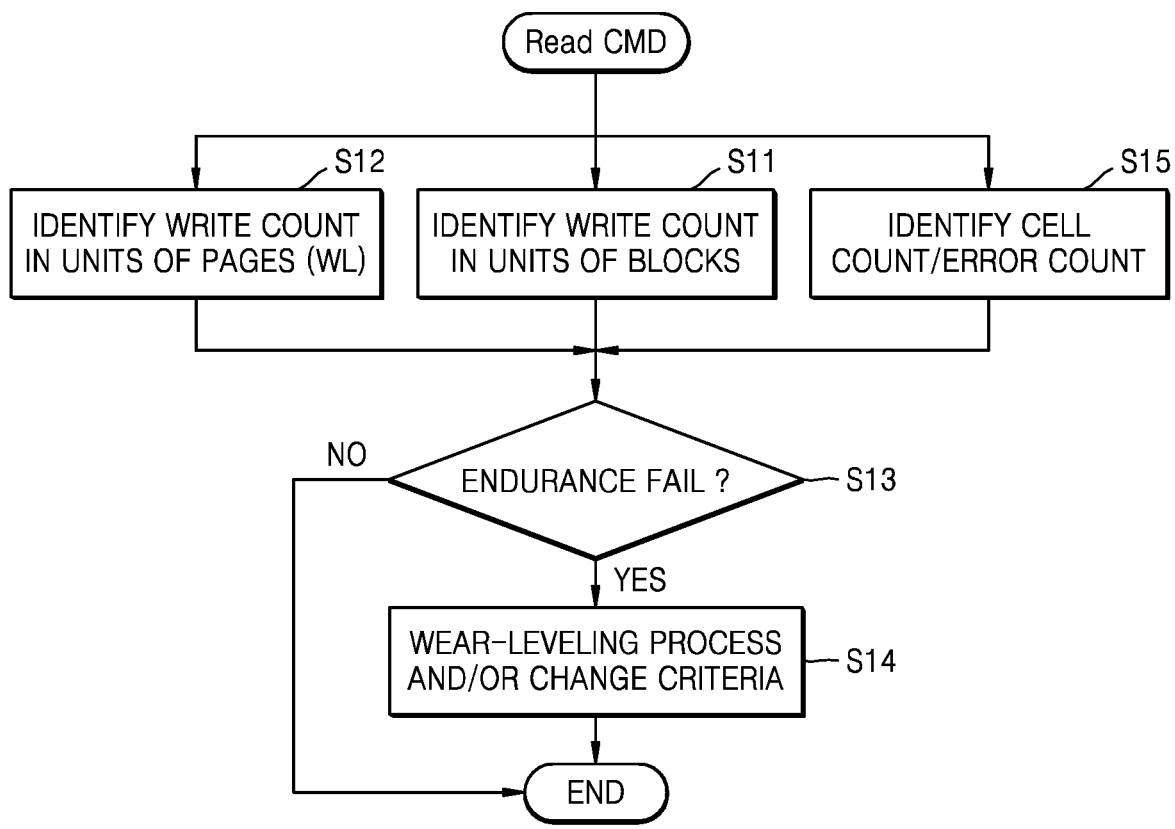

FIGS. 6 and 7 are flowcharts illustrating methods of operating the memory controller, according to example embodiments.

Referring to FIG. 6, in a memory system including a memory controller, the memory controller may read data from a region (e.g., a first page) of a memory device in response to a read request from a host. The memory controller may perform a reading operation on the first page, and at the same time, may identify a write counting value in units of blocks with respect to the cell block including the first page (S11). Also, the memory controller may identify a write counting value in units of pages (or units of word lines) of the first page (S12).

In example embodiments, the memory controller may identify the write counting value by comparing the write counting value of a block including the first page or of the first page with a respective reference value.

It may be determined whether the endurance of the first page degrades based on the identified counting values (S13). As an example, the counting values may be respectively compared with corresponding predetermined reference values, and it may be determined whether the endurance of the first page degrades according to a comparison result. Each of the counting values may indicate an endurance degradation level of the first page, and it may be determined whether the endurance degradation level exceeds a predetermined reference. As an example, when the counting value of a cell block unit and the counting value of the page unit are both greater than respectively corresponding reference values, it may be finally determined that the endurance of the first page has degraded.

When it is determined that the endurance has degraded, a wear-leveling process for ensuring reliability of data from the first page or the cell block including the first page may be performed (S14). Otherwise, when it is determined that the endurance has degraded, a control operation may be performed to change a criterion of performing the wear-leveling process on the first page or the cell block including the first page. For example, the wear-leveling may be performed with a predetermined period (or predetermined writing/reading cycle). For example, the wear-leveling may be performed every 500 k writing cycles for each page. When it is determined that the endurance of the first page has degraded, a period of the wear-leveling process with respect to the first page or the cell block including the first page may be reduced, thereby improving reliability of the data. For example, the wear-leveling may be performed every 100 k writing cycles for the first page.

FIG. 7 is a flowchart illustrating an example of a cell counting and an error counting that are further applied to determination of the endurance. Operations in FIG. 7, which are the same as those of FIG. 6, will not be described in detail.

Referring to FIG. 7, the memory controller may read data from the first page of the memory device in response to a read command from the host and may identify a cell counting (i.e., a number of on-cells or off-cells) and/or an error counting (i.e., a number of cells having an error) for determining the endurance (S15).

Referring to FIGS. 6 and 7, the memory controller may read data from the first page of the memory device in response to a read command from the host, may identify a write counting value of a block unit for determining the endurance (S11), and may identify a write counting value of a page unit (or word line unit) (S12). In addition, it may be determined whether the endurance of the first page degrades as described above (S13), and a wear-leveling process for ensuring reliability of the data read from the first page may be performed (S14).

According to example embodiments, a cell counting result and an error cell counting result may be further used to determine whether the endurance of the first page degrades. As an example, with respect to the data read from the first page, it may be predicted that the resistance distributions of the memory cells in the first page are to be shifted through an off-cell counting or an on-cell counting, and a width of the resistance distributions of the memory cells in the first page may be predicted through an error cell counting. In addition, when the resistance distribution of the first page corresponds to the resistance distribution in a page having degraded endurance because the cell counting result and the error cell counting result exceed predetermined reference values, it may be finally determined that the endurance of the first page has degraded.

Figure 8A:
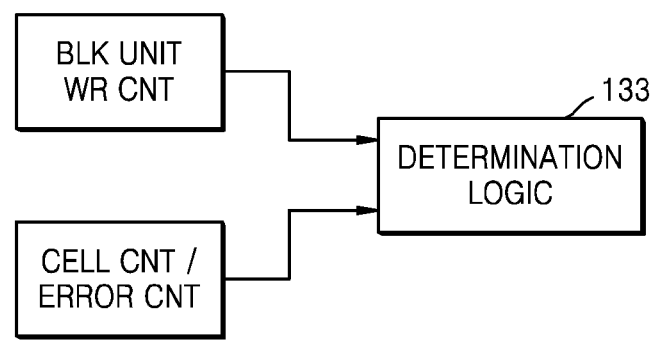
Figure 8B:
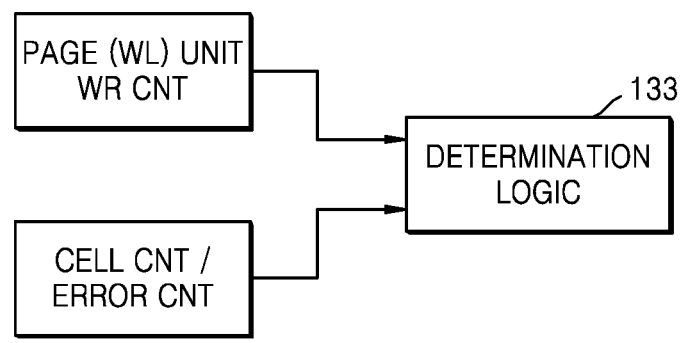

FIGS. 8A and 8B are block diagrams illustrating various conditions that are used to determine endurance according to example embodiments.

Referring to FIG. 8A, the determination logic 133 may receive various counting values according to the above embodiments and may determine whether the endurance of the page degrades, for example, it may be determined whether the endurance of the page degrades based on a write counting value in units of blocks with respect to the cell block including the page and the off-cell counting value and/or the error cell counting value.

Referring to FIG. 8B, the determination logic 133 may determine whether the endurance of the page degrades based on the write counting value in units of pages (or word lines) and the off-cell counting value and/or the error cell counting value with respect to the page (or word line including the page), as various conditions for determining the endurance. In addition, according to example embodiments, the endurance may be determined based on combinations of other various conditions than the methods illustrated with reference to FIGS. 8A and 8B.

Figure 9A:
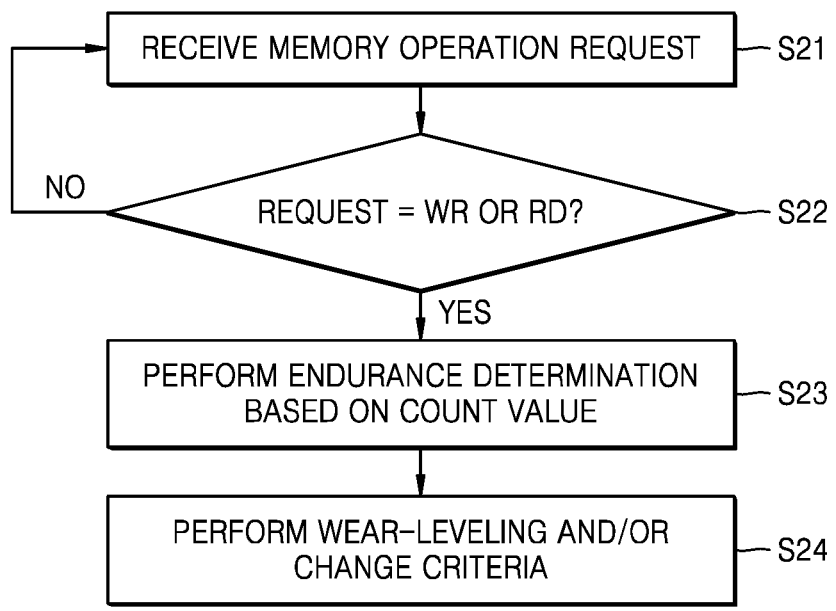
FIGS. 9A, 9B, and 9C are flowcharts illustrating various timings of performing an operation of determining endurance according to example embodiments.
Figure 9B:
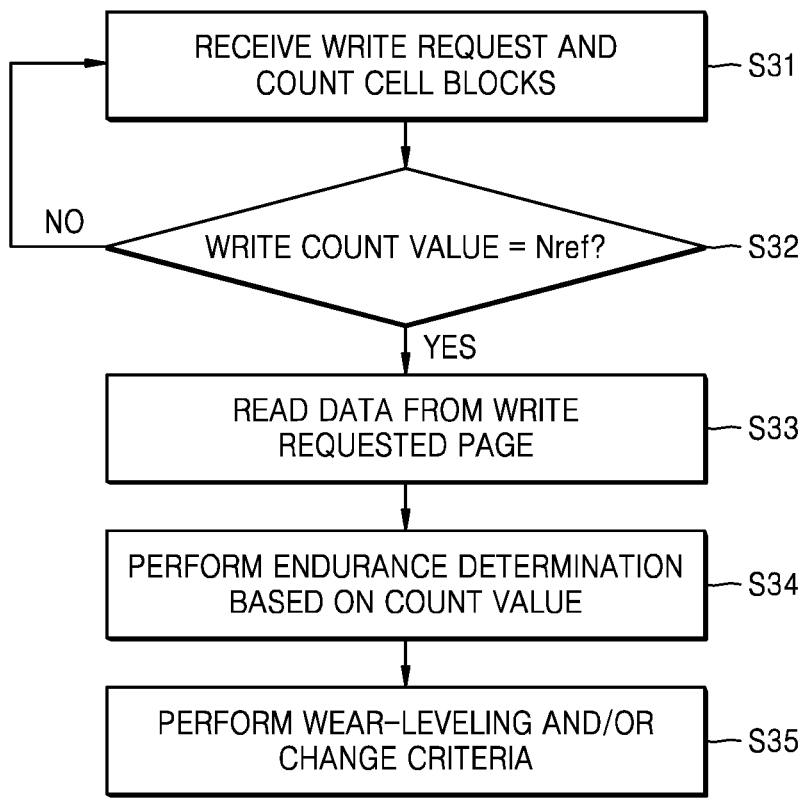
Figure 9C:
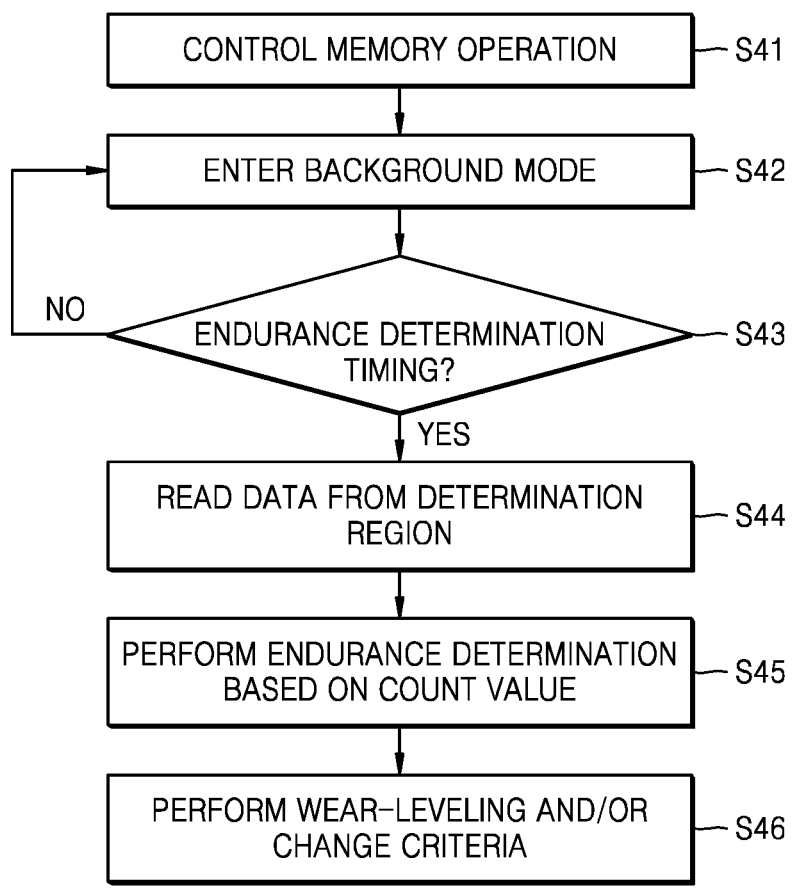

FIGS. 9A, 9B, and 9C are flowcharts illustrating various timings of performing an operation of determining endurance according to example embodiments.

Referring to FIG. 9A, the memory controller receives a memory operation request from the host (S21) and may determine whether the request sent from the host corresponds to a write request or a read request to/from the memory device (S22). As a result of determination, the memory controller may perform the operation of determining the endurance according to the above-described embodiments when a write request or a read request is provided from the host. Otherwise, with respect to the page, for which the write or read operation is requested, a write counting value of the cell block and a write counting value of the page (or word line including the page) may be identified. In addition, with respect to the page for which the write operation is requested, the write counting value on the cell block including the page may increase and the write counting value on the page (or word line including the page) may increase. Also, data may read from the page for which the write or read operation is requested, and an error cell counting value and/or off-cell counting value may be calculated from the read data.

The memory controller may perform the determination of endurance based on various counting values (S23). As an example, the counting values (e.g., write counting value, on/off cell counting value and/or error cell counting value) may be compared with respective predetermined reference values and when it is determined that the endurance of the page has degraded according to the above described embodiments, the wear-leveling process may be performed or a criterion for the wear-leveling process may be changed (S24).

FIG. 9B shows an example in which the determination of endurance is performed when the write counting value of the cell block reaches a predetermined reference value, according to example embodiments. Referring to FIG. 9B, the memory controller may receive a write request from the host and may increase the write counting value on the cell block including the page that is requested to write (S31).

It is determined whether the write counting value of the cell block corresponds to a predetermined reference value Nref (S32), and when the write counting value corresponds to the predetermined reference value Nref, the operation for determining endurance according to the above embodiments may be performed. For example, when the write requests with respect to a plurality of pages included in the cell block are received, the write counting value of the cell block may increase, and when the write counting value of the cell block reaches the reference value Nref, it may be determined whether the endurance of the page in the cell block has degraded.

The memory controller may read data from the page for which the write is requested and may calculate the error cell counting value and/or off-cell counting value with respect to the read data (S33). In addition, the memory controller may identify the write counting value of the page (or word line including the page) and may perform the determination of endurance based on the various counting values (S34). Also, when it is determined that the endurance of the page has degraded, the wear-leveling process may be performed or criterion for performing the wear-leveling process may be changed (S35).

FIG. 9C shows an example in which the determination of endurance is performed in a state where the memory system is in a background mode, according to example embodiments. Referring to FIG. 9C, the memory controller controls a memory operation on the memory device (S41) and may enter a background mode according to a predetermined cycle or when the memory operation is not performed for a predetermined period of time (S42).

The memory controller may perform the operation of determining the endurance according to the above embodiments in the background mode. According to an embodiment, the memory controller determines whether a timing for determining endurance has come (S43). When it is the timing for determining the endurance, the memory controller may determine whether the endurance of one or more pages included in the memory device has degraded, regardless of the address provided from the host. As an example, the determination about the endurance may be sequentially performed for a plurality of pages. Otherwise, the write counting value of the cell block and/or the write counting value of the page (or word line including the page) is identified and then the determination on the endurance may be performed with respect to pages, the write counting values of which exceed a predetermined reference value.

The memory controller reads data from the region where the endurance determination is performed (e.g., one or more pages) (S44) and may calculate the error cell counting value and/or the off-cell counting value from the read data. In addition, the determination on the endurance may be performed based on the various counting values (S45) and when it is determined that the endurance of the page has degraded, the wear-leveling process may be performed or a criterion for performing the wear-leveling process may be changed (S46).

Figure 10:
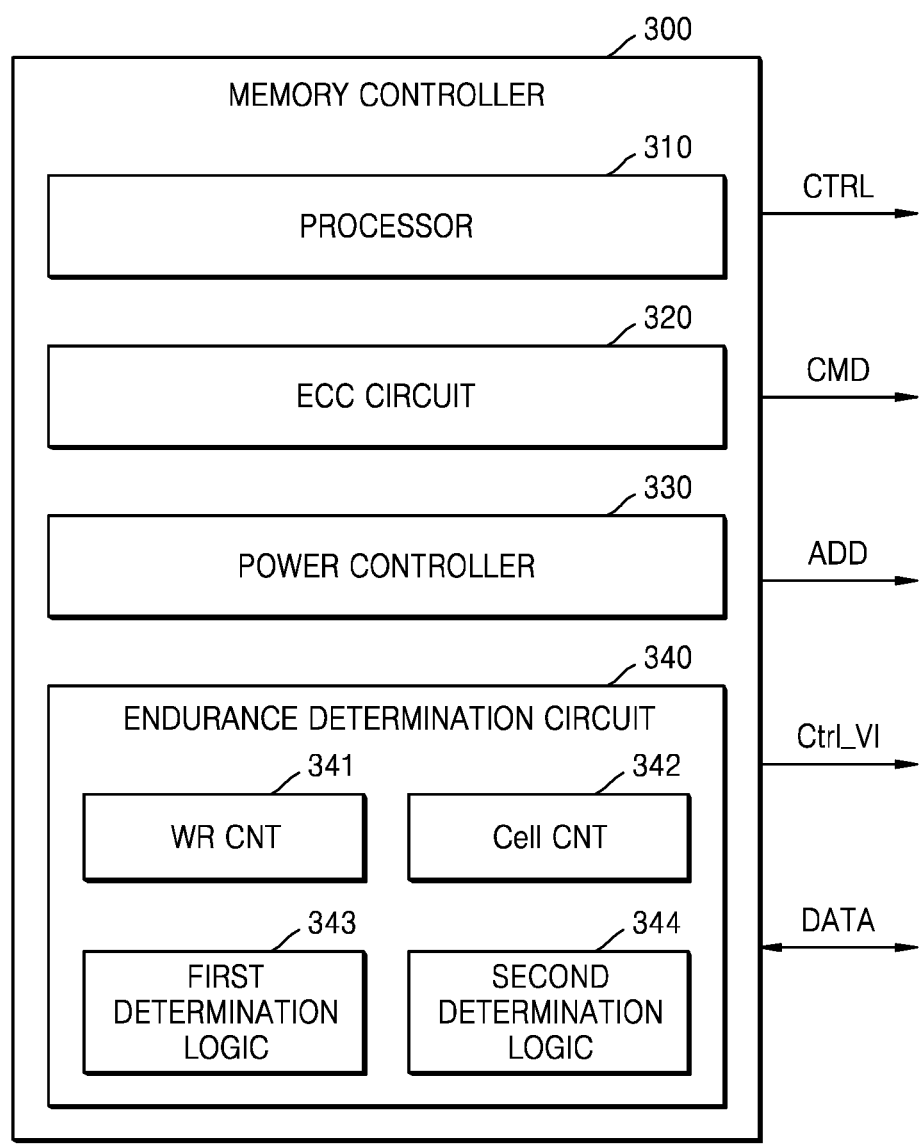
FIGS. 10 to 12, 13A, 13B, 14, and 15 are diagrams illustrating methods of determining endurance through first and second determination operations, according to example embodiments.

FIG. 10 is a block diagram of a memory controller 300 according to example embodiments.

Referring to FIG. 10, the memory controller 300 may include a processor 310, an ECC circuit 320, a power controller 330, and an endurance determination circuit 340. According to example embodiments, the endurance determination circuit 340 may include a write counter 341, a cell counter 342, a first determination logic 343, and a second determination logic 344. The write counter 341 and the cell counter 342 may perform various counting operations for determining endurance of the memory device according to the above embodiments, and the first determination logic 343 may primarily determine degradation in the endurance of the memory device based on various counting values.

When it is determined that the endurance has degraded according to a result of a first determination operation, the memory controller 300 may perform a second determination operation to re-determine the degradation in the endurance. According to an embodiment, the memory controller 300 may re-write data on the region (e.g., page) which is determined to have degraded endurance, by using a writing current having a lower level (e.g., low writing current) than that of a normal writing operation (e.g., normal writing current), and the power controller 330 may output a power control signal Ctrl_VI including a controlling operation for reducing the level of the writing current for the memory device. In addition, the memory controller 300 may control an operation of reading (or re-reading) data that is re-written by using the low writing current, and the read data may be provided to the endurance determination circuit 340. A value of the normal writing current may be predetermined in product specifications.

When performing the second determination operation, the cell counter 342 may perform an error cell counting and/or off-cell counting operation from the read data and may secondarily determine the endurance of the memory device based on the cell counting values. As an example, the second determination logic 344 may compare the error cell counting value with a predetermined reference value or compare the off-cell counting value with a predetermined reference value, and according to a comparison result, may secondarily determine degradation in the endurance of the memory device. When it is determined the endurance has degraded in the first and second determination operations, the endurance determination circuit 340 may finally determine that the endurance of a page in the memory device has degraded. As it is determined that the endurance has degraded, a wear-leveling process may be performed based on a control of the processor 310.

According to the embodiments, it may be accurately determined whether the degradation in reliability of the memory device is caused by the degradation in the endurance through the first and second determination operations, and the wear-leveling process may be performed on the data of the page having degraded reliability due to the reduced endurance. For example, it may be prevented that the wear-leveling process is performed on the data having just one-time error during the reading process, and the wear-leveling process may be properly performed only on the data of the page having the degraded endurance to improve reliability of the data.

In the embodiment illustrated with reference to FIG. 10, the second determination may be performed by various methods. As an example, the memory cells may have set states or reset states according to programming states and set writing operations using the low set writing current (i.e., lower than a normal set writing current) may be performed on the memory cells in the set states from among the memory cells. Otherwise, reset writing operations using the low reset writing current (i.e., lower than a normal reset writing current) may be performed on the memory cells in the reset states from among the memory cells. The set writing operations and the reset writing operations may be performed together on the above memory cells by using the respective low writing current.

Figure 11:
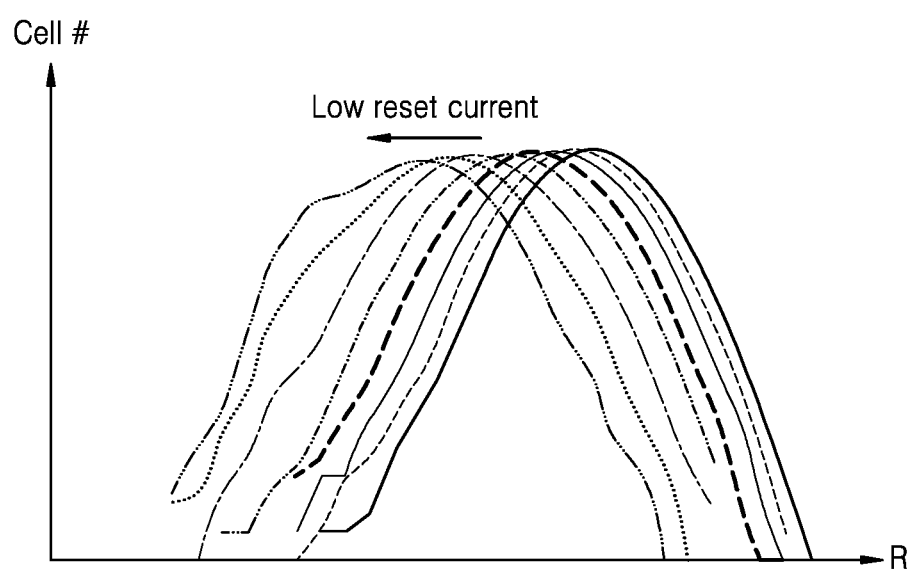

FIG. 11 is a diagram illustrating resistance distributions according to degrees of endurance of the memory cells when the writing operation is performed using the low writing current. FIG. 11 shows an example of the resistance distributions in the reset state according to a level of the low reset writing current when the endurance of the memory cells has degraded. For example, FIG. 11 shows various resistance distributions resulting from writing operations using variable reset writing currents.

Referring to FIGS. 10 and 11, when the number of writing operations on the memory cells is large enough to degrade the endurance, and when the reset writing operation is performed by using the low reset writing current, the resistance distributions may have a distribution characteristic that may cause degradation in reliability of the data. For example, when the reset writing operation is performed on the memory cells having degraded endurance by using a normal writing current, the resistance distribution in the reset state may be similar to that of a case in which endurance of the memory cells does not degrade or a variation width of the distribution may be similar to that of a case in which endurance of the memory cells does not degrade. However, when the reset writing operation is performed on the memory cells having degraded endurance by using the low writing current, the resistance distribution in the reset state may have a greater variation width than that of a case in which endurance of the memory cells does not degrade.

When the endurance determination circuit 340 performs the second determination operation according to the embodiments, the data written using the low writing current is read. Then, a cell counting operation is performed on the read data to analyze the resistance distributions of the memory cells and it may be exactly determined whether the endurance of the memory cells has degraded. For example, by using the low writing current, the resistance distributions of a case in which the endurance of the memory cells does not degrade may be clearly discriminated from those of a case in which the endurance of the memory cells has degraded, and thus the second determination operation may be performed based on the data writing using the low writing current.

FIGS. 12, 13A, 13B, 14, and 15 are flowcharts showing examples of a method of determining endurance in a case where the second determination operation is applied, according to example embodiments.

Figure 12:
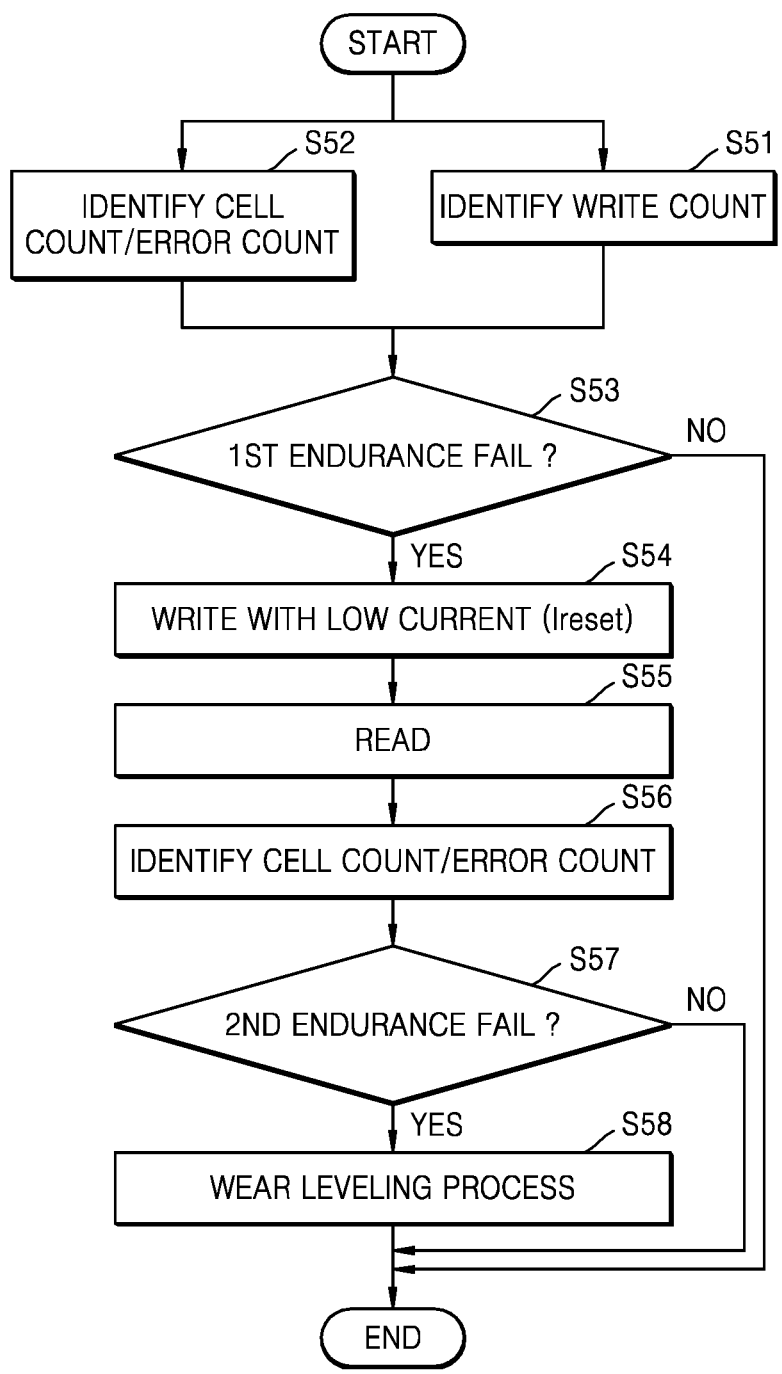

Referring to FIG. 12, the first determination operation may be performed to determine the endurance of the memory device at various timings according to the above-described embodiments. As an example, the first determination operation may be performed when a write request or a read request is provided from the host, when the write counting value exceeds a predetermined reference value, or in a background mode.

Assuming that endurance of a first page is determined, the write counting value in the units of cell blocks and/or in units of pages may be identified in the first determination operation (S51), and a cell counting value may be identified from the data read from the first page (S52). According to a result of identifying the counting values, it may be determined whether the endurance degrades primarily (S53), and when it is determined that the endurance of the first page has degraded in the first determination operation, a second determination operation may be performed.

In the second determination operation, the writing operation may be performed by using a writing current having a lower level than that of the normal writing current according to the above-described embodiments (S54), as an example, data of a reset state may be written on the first page by using the low reset current. In addition, a reading operation of the data written by using the low reset current may be performed (S55) and the number of error cells and/or the number of off-cells may be identified via a cell counting operation on the read data (S56).

It may be secondarily determined whether the endurance has degraded based on a result of reading the data (S57). When it is also determined that the endurance of the first page has degraded in the second determination operation, it may be finally determined that the endurance of the first page has degraded. When it is determined that the endurance of the first page has degraded, a wear-leveling process for ensuring reliability of data from the first page or the cell block including the first page may be performed (S58).

Figure 13A:
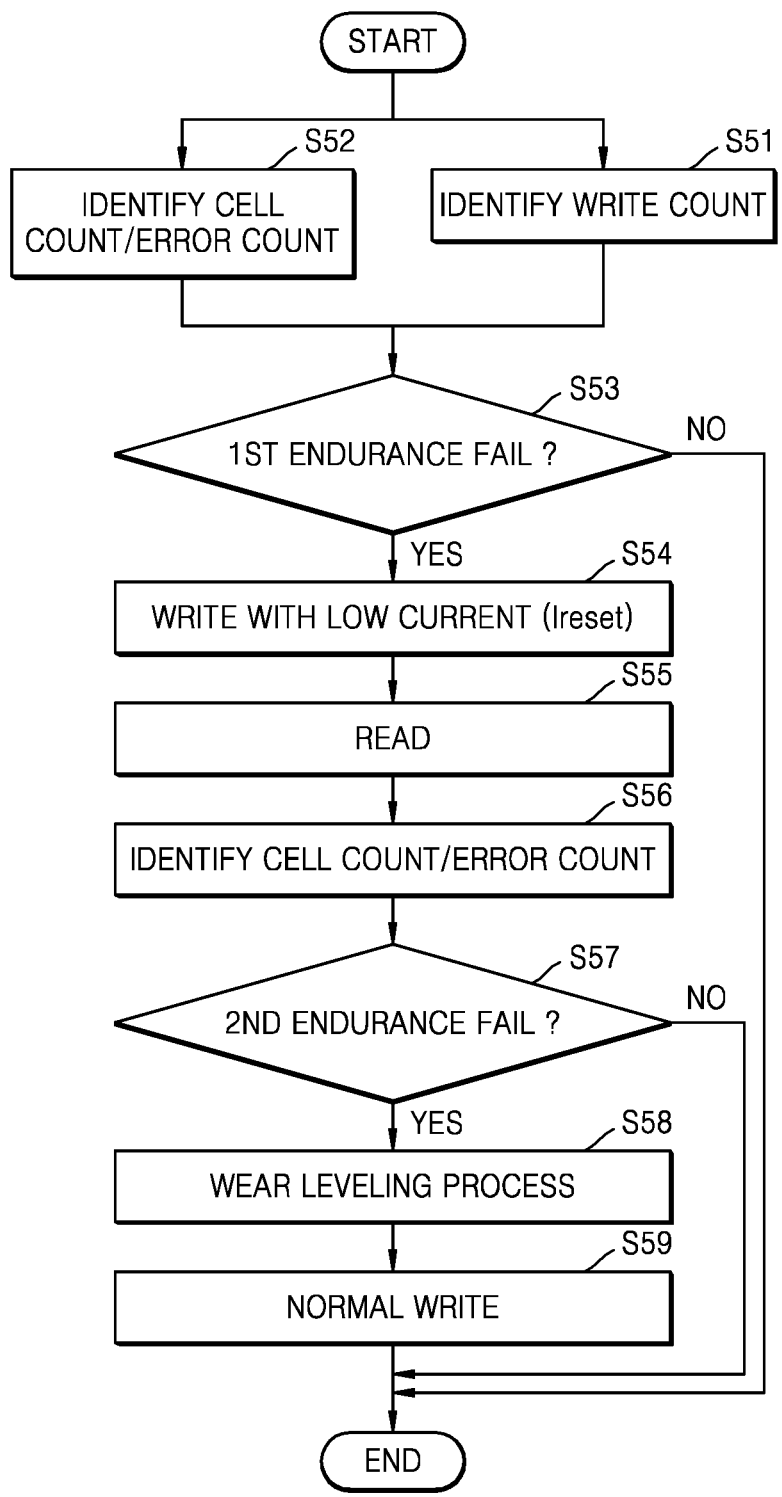
Figure 13B:
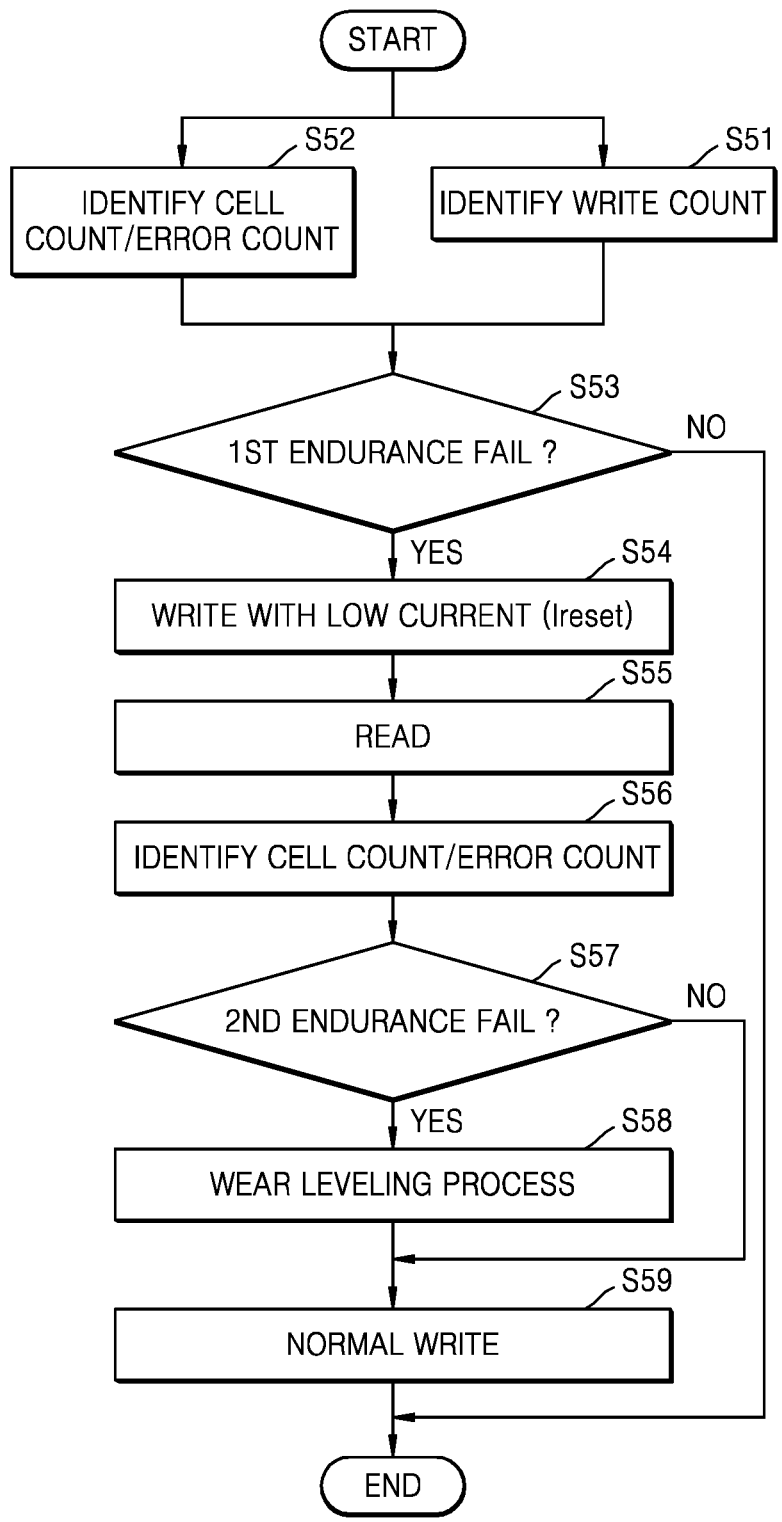

Referring to FIGS. 13A and 13B, operations S51 to S58 illustrated in FIG. 12 may be performed and a writing operation using the normal writing current may be further performed on the first data on which the data is written by using the low writing current (i.e., low reset current) in the second determination operation (S59). FIG. 13A shows an example in which the writing operation using the normal writing current is further performed only when it is determined that the endurance of the first page has degraded in the second determination operation, and FIG. 13B shows an example in which the writing operation using the normal writing current is further performed even when it is determined that the endurance of the first page does not degrade in the second determination operation. For example, in FIG. 13A, when it is determined that the endurance of the first page has degraded, the writing operation may be further performed by using the normal writing current in order to improve the resistance distributions of the first page. In FIG. 13B, the writing operation may be further performed by using the normal writing operation even when it is determined that the endurance of the first page does not degrade, thereby ensuring data reliability.

Figure 14:
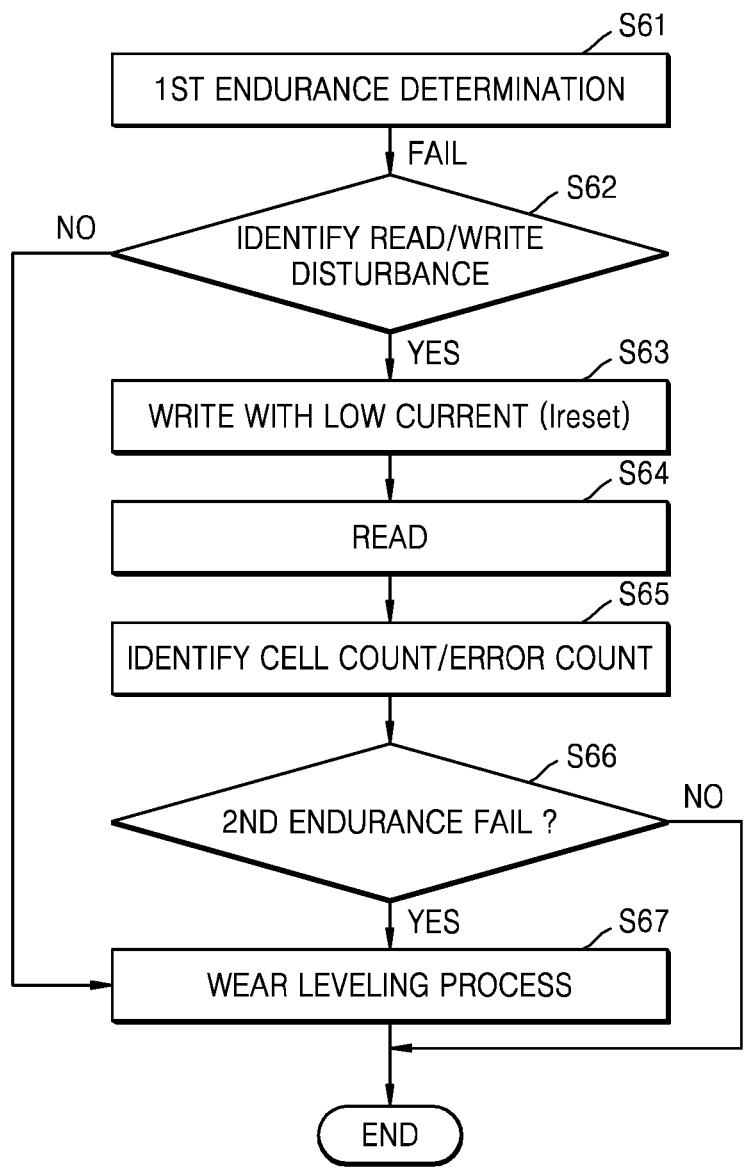

FIG. 14 shows an example in which it may be further identified whether there is a disturbance in reading/writing when the second determination on the endurance of the first page is performed. In the example of FIG. 14, descriptions about the first determination of the endurance are omitted for convenience of description.

The first operation of determining whether the endurance of the first page has degraded is performed (S61), and when it is determined that the endurance of the first page has degraded (i.e., the endurance degrades primarily), the second determination operation according to the above described embodiments may be performed. Accordingly, a writing operation using the low writing current (S63), an operation of reading the data written by using the low writing current (S64), and an error cell counting and/or an off-cell counting operation (S65) may be performed. In addition, it may be determined whether the endurance of the first page has degraded based on results of the counting operations in S65 (S66). When it is also determined that the endurance of the first page has degraded in the second determination operation, a wear-leveling process may be performed on the first page or the cell block including the first page may be performed (S67).

According to example embodiments, an additional identification may be further applied to the second determination operation. As an example, whether the endurance of the first page has degraded may be determined based on various counting values in the first determination, and an additional identification operation for identifying accuracy of the first determination based on the counting values may be performed.

For example, the resistance distributions of the memory cells in the first page may be predicted based on the error cell and/or off-cell counting values, and it may be checked whether the variation in the resistance distributions of the first page is caused by disturbance of the writing or reading operations on adjacent memory cells (S62). For example, the resistance distributions of the memory cells in the first page may be disturbed by the writing or reading operations on adjacent memory cells, and accordingly, it may be determined that the endurance has degraded due to the resistance distribution even though the endurance of the memory cells in the first page has not degraded yet.

According to example embodiments, it may be identified whether there is the disturbance by various methods. As an example, the number of writing and/or reading operations on one or more memory cells adjacent to the first page is checked, and when the checked number of writing and/or reading operations on the one or more memory cells adjacent to the first page is equal to or less than a predetermined reference value, it may be determined that the endurance of the first page has degraded. Then, the memory controller 100 may perform the wear-leveling process on the first page or the cell block including the first page in the step S67. However, when the checked number of writing and/or reading operations on the one or more memory cells adjacent to the first page exceeds the predetermined reference value, a writing operation may be performed by using the low writing current in the step S63.

In the embodiment illustrated in FIG. 14, it is described that the determination operation using the low writing current is performed according to a result of determining whether there is a disturbance, but the invention is not limited thereto. As an example, the determination operation using the low writing current is performed and then the operation of determining whether there is the disturbance may be performed. Otherwise, the determination operation using the low writing current and the operation of determining whether there is the disturbance may be performed together, and when it is determined that the endurance of the first page has degraded in at least one determination operation, it may be finally determined that the endurance of the first page has degraded.

In the embodiments illustrated in FIG. 14, it is described that the determination about whether there is the disturbance is performed in the second determination operation, but the invention is not limited thereto. As an example, the disturbance determination may be performed together with the operation of identifying the error cell counting value and/or the off-cell counting value in the first determination operation. Alternatively, when it is identified that the endurance of the first page has degraded based on the error cell and/or off-cell counting value in the first determination operation, it may be additionally determined whether there is a disturbance due to the writing and reading operations on memory cells adjacent to memory cells of the first page.

Figure 15:
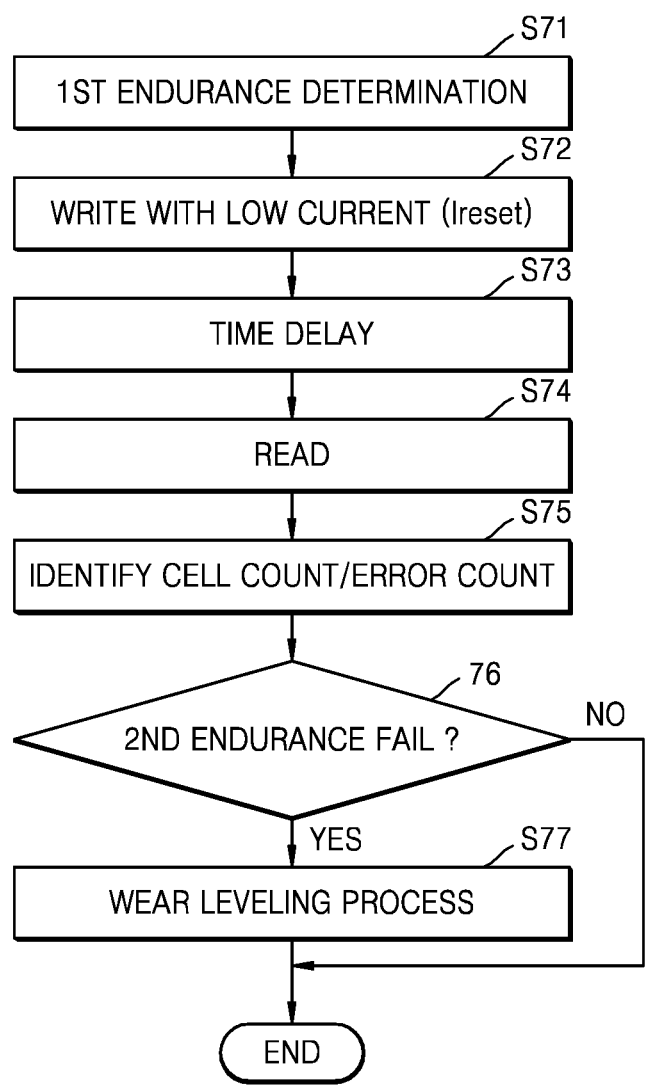

FIG. 15 shows an example in which time delay is applied to the second determination operation. Descriptions about operations of FIG. 15, which are similar to or the same as those of the previous embodiments, are omitted, and detailed descriptions about the first determination operation will be omitted for convenience of description.

Referring to FIG. 15, the first determination operation about whether the endurance of the first page has degraded is performed (S71). When it is determined that the endurance of the first page has degraded, a second determination operation including a writing operation using a low writing current (S72), an operation of reading data that is written by using the low writing current (S74), and an error cell counting operation and/or an off-cell counting operation (S75) may be performed. It may be secondarily determined whether the endurance has degraded based on the above counting results (S76), and according a result of determination, a wear-leveling process may be performed on the first page or a cell block including the first page (S77).

When the data is written on memory cells having degraded endurance by using the low writing current, the resistance distributions of the memory cells may have similar distributions to those of a case in which the normal writing current is used right after finishing the writing operation, but when a predetermined time period is elapsed, the distribution characteristic may degrade as shown in the graph of FIG. 11. According to example embodiments, an operation of applying predetermined delay time (S73) may be further added after performing the writing operation using the low writing current, and when the reading operation is performed on the first page after applying the time delay, accuracy of the second determination operation may be further improved.

Also, the time delay may be set in various values in advance in the memory system. As an example, a test including the writing operation using the low writing current and an operation of predicting the resistance distribution by using the read data may be performed and according to a test result, an appropriate delay value for determining the memory cells having degraded endurance may be calculated. Also, the time delay may vary depending on the level of the low writing current used in the writing operation. For example, the memory controller 100 may include a timer configured to generate the time delay from an end time of the writing operation (S72) to a start time of the read operation (S74).

Figure 16A:
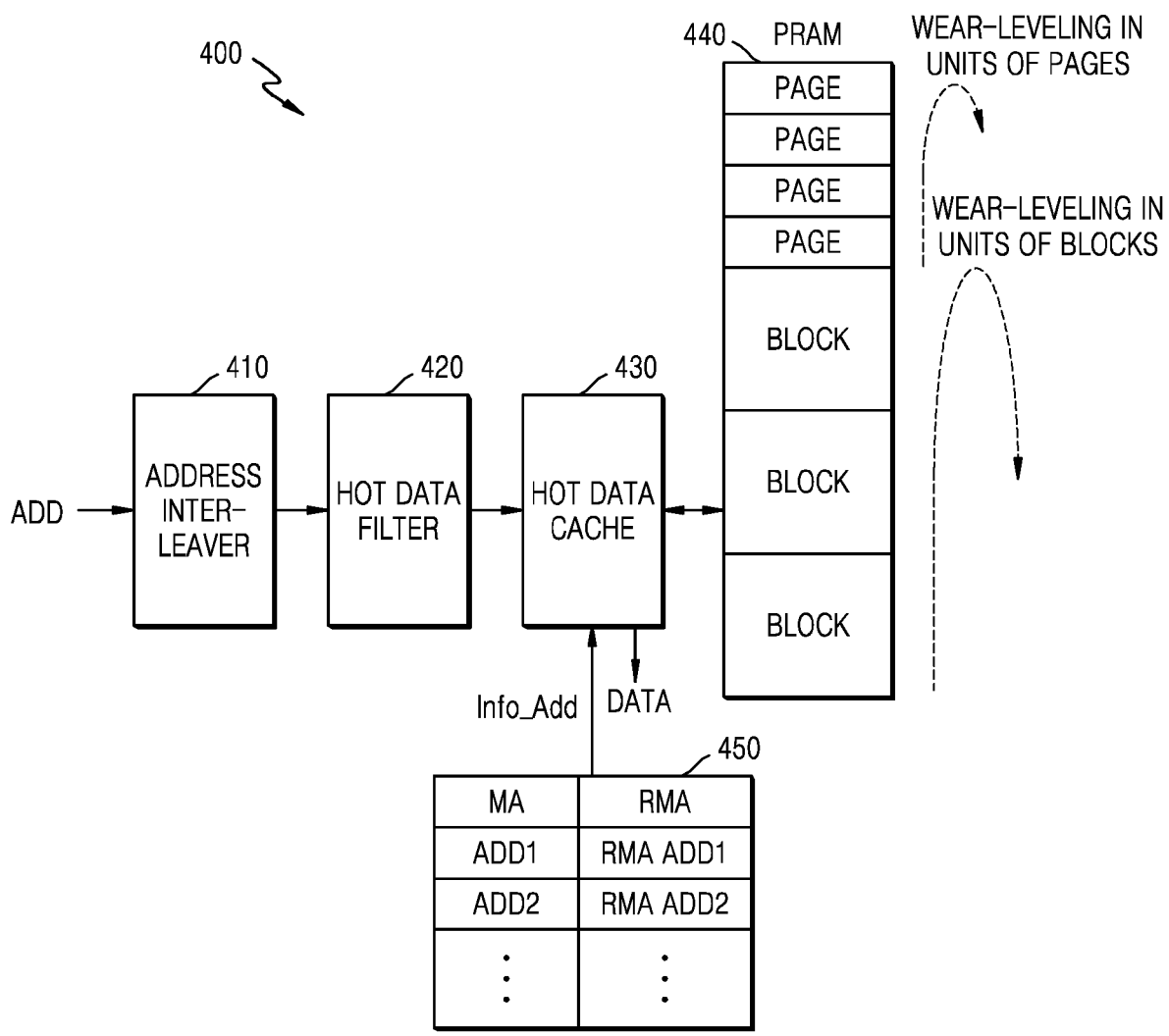
FIGS. 16A and 16B are block diagrams of a memory system performing a wear-leveling according to example embodiments.
Figure 16B:
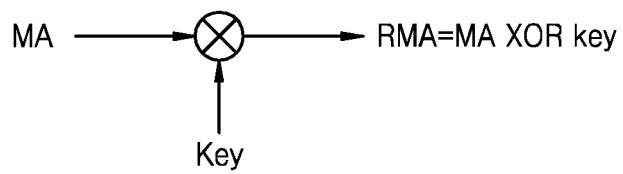

FIGS. 16A and 16B are block diagrams of a memory system 400 performing a wear-leveling according to example embodiments.

Referring to FIG. 16A, the memory system 400 includes a memory controller and a memory device 440 and the memory controller may include an address interleaver 410, a hot data filter 420, and a hot data cache 430. Also, FIG. 16A shows a PRAM as the memory device 440 that includes a plurality of cell blocks. Each of the cell blocks may include a plurality of pages.

The memory system 400 may copy a part of data stored in the memory device 440 to the hot data cache 430 and the memory system 400 may provide the data stored in the hot data cache 430 to a host in response to an access request from the host. The address interleaver 410 may perform interleaving on an address ADD from the host so that the data that is requested to be written may be stored after being distributed in the plurality of cell blocks of the memory device 440, and the hot data filter 420 may filter hot data having a high accessing frequency from among the data written in the memory device 440. The hot data cache 430 may temporarily store a part of data, which is accessed, from the memory device 440.

According to example embodiments, a wear-leveling process may be performed on data in a region (e.g., a page, a word line, a cell block, etc.) having degraded endurance after performing the operation of determining the endurance. According to the above embodiments, the wear-leveling process may be performed in units of pages or in units of cell blocks, and accordingly address indicating the data may be changed after the wear-leveling process. The changed address information is stored in a mapping table 450 and the hot data cache 430 uses the changed address information of the mapping table 450 to access the memory device 440.

Referring to FIG. 16B, the address may be converted to a remapped address by using a key having a random value. In one example of FIG. 16B, a remapped address RMA is generated based on an XOR operation of a previous address MA and a key, and mapping information between the previous address MA and the remapped address RMA may be provided to the hot data cache 430.

Figure 17:
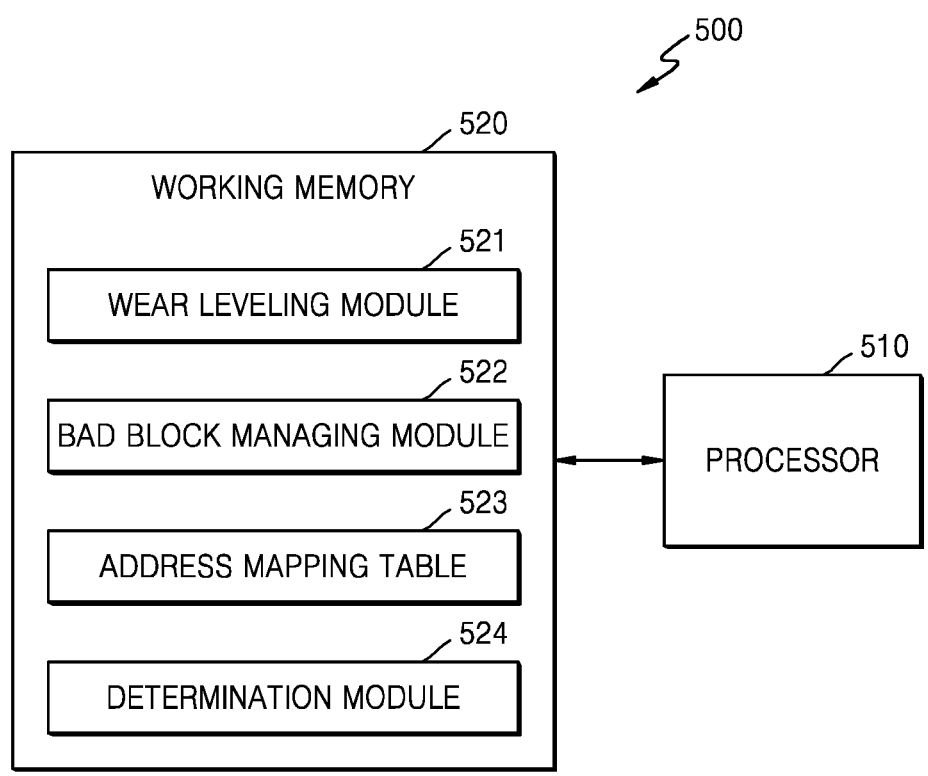
FIG. 17 is a block diagram of a memory controller according to a certain embodiment.

FIG. 17 is a block diagram of a memory controller 500 according to a certain embodiment. FIG. 17 shows an example in which a function of determining endurance is implemented via software.

The memory controller 500 may include a processor 510 and a working memory 520, and elements for implementing functions described above with the embodiments may be loaded on the working memory 520 as firmware. As an example, according to the function implemented via the firmware, a wear-leveling module 521, a bad block management module 522, an address mapping table 523, and a determination module 524 may be loaded on the working memory 520.

The embodiments are described, and illustrated in the drawings, in terms of functional modules. These modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These modules may be implemented by a processor (e.g., a microprocessor, a controller, a CPU, a GPU) or processors that are programmed using software (e.g., microcode) to perform various functions discussed herein. Each module may be implemented by dedicated hardware, or as a combination of dedicated hardware to perform some functions and a processor to perform other functions. Also, each module of the embodiments may be embodied by physically separate circuits and need not be formed as a single integrated.

The wear-leveling module 521 prevents memory cells from being worn out as the number of writing and/or reading operations on a cell block or page at a certain location, wherein the cell block or the page includes the memory cells. As an example, in a case where it is determined that the endurance has degraded because the number of writing and/or reading operations on a cell block or a page at a certain location according to the above disclosed embodiments, the processor 510 executes the wear-leveling module 521 to perform a wear-leveling process in units of cell blocks or in units of pages. Also, the bad block management module 522 performs a management operation on cell blocks having defects, and as an example, when the number of writing and/or reading operations on a cell block at a certain location exceeds a critical value, the bad block management module 522 may process the cell block as a bad block. According to an example, when it is determined that endurance of a certain page has degraded according to the above described embodiments, a cell block including the page may be processed as a bad block. For example, the bad block may be determined before performing the wear-leveling process.

The address mapping table 523 may store conversion information between an address provided from the host and an address indicating a physical location where the data is actually stored, through an address conversion operation. As an example, the data may be transferred in units of pages or in units of cell blocks according to the wear-leveling process, and address conversion information according to the transfer may be stored in the address mapping table 523. The determination module 524 may perform first and second operations of determining endurance according to the above disclosed embodiments based on a write counting value and/or a cell counting value.

Figure 18:
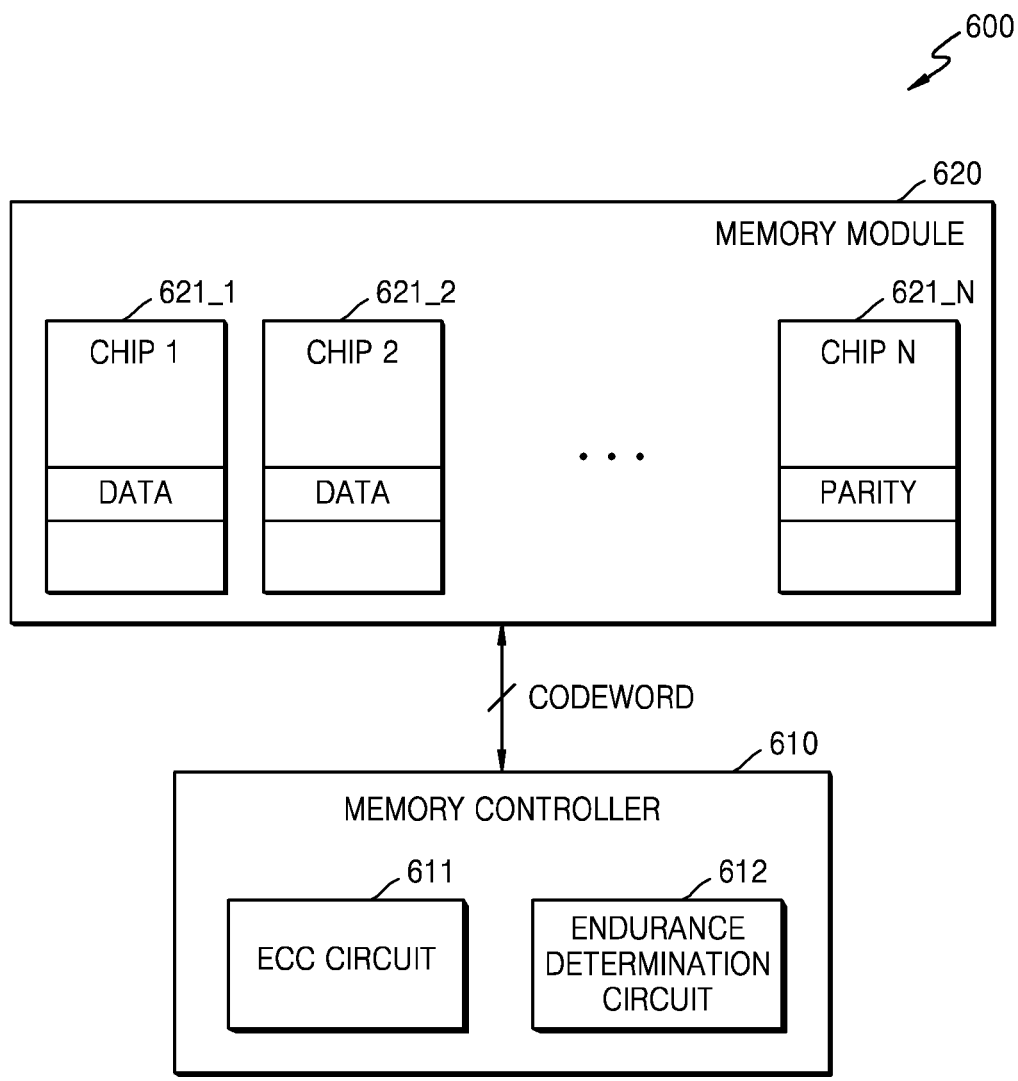
FIG. 18 is a block diagram of a memory system according to a certain embodiment.

FIG. 18 is a block diagram of a memory system 600 according to a certain embodiment. FIG. 18 shows an example in which the memory system 600 includes a memory controller 610 and a memory device that corresponds to a memory module 620. The memory controller 610 may include an ECC circuit 611 and an endurance determination circuit 612, and the memory module 620 may include first to N-th memory chips 621_1 to 621_N that are mounted on a module board.

The ECC circuit 611 may generate parity data Parity through an ECC encoding operation on data DATA, a codeword including the data DATA and the parity data Parity may be stored in the first to N-th memory chips 621_1 to 621_N, and the codeword may be read from the first to N-th memory chips 621_1 to 621_N. The endurance determination circuit 612 may perform the operation of determining endurance according to the above disclosed embodiments, by using each of the data DATA read from the first to N-th memory chips 621_1 to 621_N and the parity data Parity. Also, the wear-leveling process in various ways may be performed according to a result of determining the endurance, for example, the wear-leveling process may be performed in various types, e.g., in units of pages, in units of cell blocks, in units of memory chips, etc.

In example embodiments, the memory module 620 may be implemented as a single in-line memory module (SIMM) or a dual in-line memory module (DIMM). The memory module 620 may correspond to various kinds of DIMMs, e.g., FB-DIMM, LR-DIMM, etc. Alternatively, the memory module 620 may correspond to a non-volatile DIMM (NVDIMM) on which a non-volatile memory (e.g., a flash memory, not shown) in order to deal with issues of a volatile memory, data of which is lost when the electric power is turned off.

As various kinds of modules, when the memory module 620 includes a PRAM as a resistive memory, the memory module 620 may be referred to as P_DIMM. One or more embodiments may be applied to various kinds of modules, as an example, when the memory module 620 includes cross-point memory chips having three-dimensional (3D) resistive memory cells, the memory module 620 may be referred to as an XPoint DIMM (or 3D XPoint DIMM).

Figure 19:
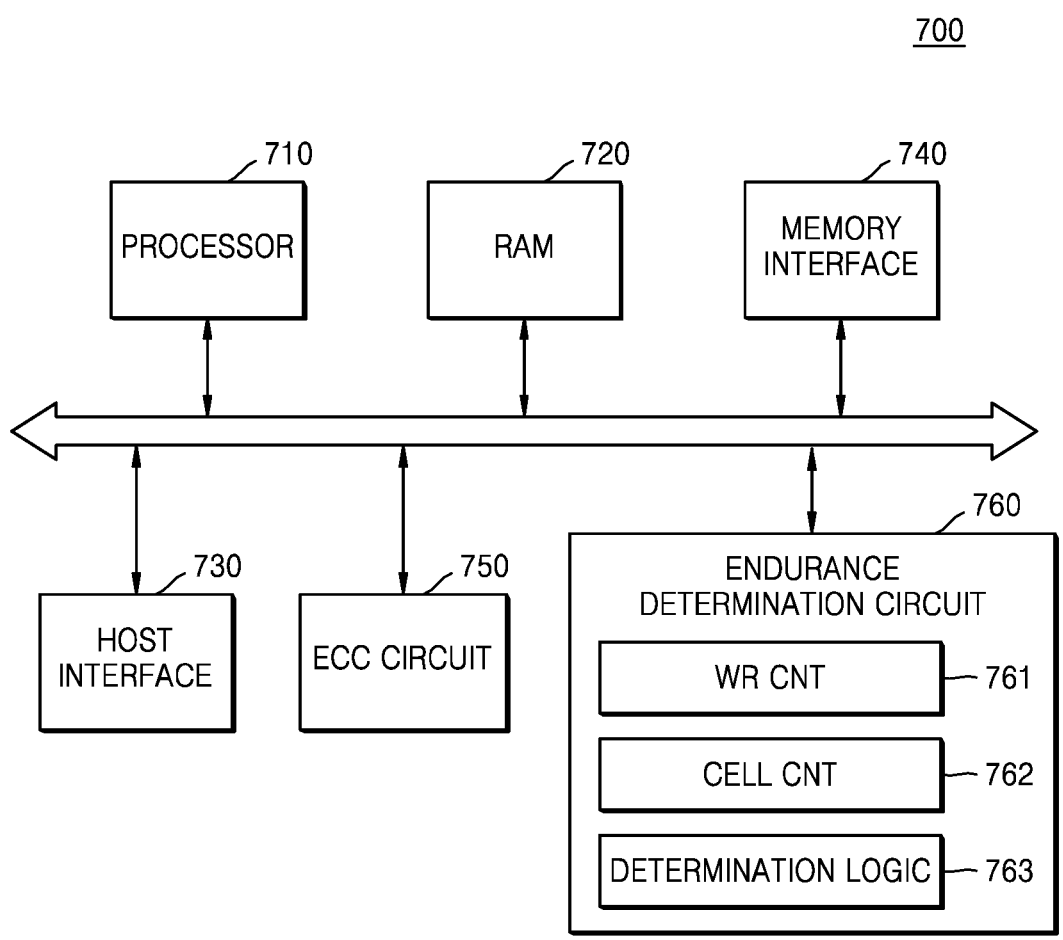
FIG. 19 is a block diagram showing an implemented example of a memory controller according to a certain embodiment.

FIG. 19 is a block diagram showing an implemented example of a memory controller 700 according to a certain embodiment.

Referring to FIG. 19, the memory controller 700 may include a processor 710, a RAM 720, a host interface 730, a memory interface 740, an ECC circuit 750, and an endurance determination circuit 760. As an embodiment, the memory controller 700 may be a device included in an application process (AP, not shown) that may be implemented as a system-on-chip. In addition, the endurance determination circuit 760 may include a write counter 761, a cell counter 762, and a determination logic 763.

The processor 710 may include a central processing unit or a micro-processor and may control overall operations of the memory controller 700. For example, the processor 710 may be configured to drive software or firmware for controlling the memory controller 700, and the software or the firmware may be loaded on the RAM 720 to be operated. The RAM 720 may be used as an operation memory, a cache memory, or a buffer memory of the processor 710. The RAM 720 may temporarily store data that is to be written in the memory device or data read from the memory device.

The host interface 730 interfaces with the host to receive a request for memory operation from the host. For example, the host interface 730 receives various requests such as a read request, a write request of data, etc. from the host HOST, and may generate various internal signals for performing memory operations on the memory device in response to the requests.

The memory interface 740 may provide an interface between the memory controller 700 and the memory device (not shown), for example, write data and read data may be transmitted to and received from the memory device via the memory interface 740. Also, the memory interface 740 may provide the memory device with commands and addresses and may receive various information from the memory device to provide the information to the inside of the memory controller 700.

The ECC circuit 750 may detect an error of read data through an ECC decoding process recited in the above embodiment, and a result of detecting the error may be used in the operation of determining endurance in the endurance determination circuit 760. The endurance determination circuit 760 may perform the operation of determining endurance according to the above disclosed embodiments, for example, the write counter 761 may perform a write counting operation in units of cell blocks and/or in units of pages and the cell counter 762 may perform an error cell counting operation and/or an off-cell counting operation on the read data. The determination logic 763 may perform a determination operation based on various counting values. As described above, when the endurance determination includes first and second determination operations, the cell counter 762 performs the error cell counting and/or off-cell counting operation on the data read from a page, in which the data is written using the low writing current, and the determination logic 763 may perform the determination by further using a counting result.

Various functions that the endurance determination circuit 760 may perform may be implemented via hardware or software, or a combination of the hardware and software. As an example, when a determination operation for comparing various counting values with reference values is implemented via hardware, the determination operation may be performed by a hardware circuit arranged in the endurance determination circuit 760. Alternatively, when the determination operation for comparing various counting values with the reference values is implemented via software, a program provided on inside or outside of the endurance determination circuit 760 is loaded on the RAM 720 and the processor 710 may execute the program to perform the determination operation.

While the inventive concept has been particularly shown and described with reference to embodiments thereof, it will be understood that various changes in form and details may be made therein without departing from the spirit and scope of the following claims.

What is claimed is:

1. A memory controller that controls a memory operation on a memory device, the memory controller comprising:
an error correction code (ECC) circuit configured to detect an error from data read from the memory device; and
an endurance determination circuit configured to:
check a first counting value indicating a number of writing operations on the memory device and a second counting value indicating, based on the data read from the memory device, a number of first memory cells of the memory device in a certain logic state, and
perform a first determination operation for determining whether endurance of the memory device has degraded based on a checking result,
wherein the memory controller is configured to re-write data in a first page of the memory device by using a writing current having a level that is lower than a level of a normal writing current, in response to a result of the first determination operation on the first page having degraded endurance, and
wherein the endurance determination circuit is further configured to perform a second determination operation for determining whether the endurance of the first page has degraded in response to data re-written in the first page.

2. The memory controller of claim 1, wherein the endurance determination circuit is configured to perform the first determination operation in response to a write request or a read request from outside of the memory controller.

3. The memory controller of claim 1, wherein the memory device includes a plurality of cell blocks, each cell block including a plurality of pages, and each page including a plurality of memory cells,
wherein, when it is determined whether endurance of a first page of the memory device has degraded:
the first counting value comprises at least one of a value of counting a number of writing operations on the first page and a value of counting a number of writing operations on a first cell block of the memory device including the first page, and
the second counting value comprises a value of counting the number of first memory cells having off-cells having the certain logic state from among the memory cells of the first page.

4. The memory controller of claim 3, wherein the first counting value comprises the value of counting the number of writing operations on the first cell block including the first page and the second counting value comprises the value of counting the number of second memory cells from among the memory cells of the first page, and
wherein the endurance determination circuit is configured to determine that the endurance of the first page has degraded, in response to the first counting value exceeding a first reference value and the second counting value exceeding a second reference value.

5. The memory controller of claim 3, wherein the endurance determination circuit comprises:
a write counter comprising a first counter configured to count the number of writing operations on the first cell block;
a cell counter comprising a second counter configured to count the number of second memory cells; and
a determination logic configured to determine whether the endurance has degraded based on the first counting value and the second counting value.

6. The memory controller of claim 1, further comprising:
a processor configured to control the memory operation; and
a wear-leveling module comprising a program for performing a wear-leveling process on memory cells of the memory device having degraded endurance,
wherein, when it is determined that the endurance of the memory device has degraded, the processor executes the wear-leveling module to write data of a region of the memory device having degraded endurance to another region of the memory device.

7. The memory controller of claim 6, wherein, when the region having degraded endurance includes a first page in a first cell block, the wear-leveling module writes data of the first page to a second page in the first cell block, writes data of the first page to a third page in a second cell block, or writes data of the first cell block to the second cell block.

8. The memory controller of claim 1, wherein the data re-written in the first page is in a reset state.

9. The memory controller of claim 1, further comprising:
a processor configured to control overall operations of the memory controller; and a wear-leveling module comprising a program for performing a wear-leveling process on memory cells of the memory device having degraded endurance,
wherein, when it is determined that the endurance of the first page has degraded in both of the first and second determination operations, the processor executes the wear-leveling module to write data of the first page to a second page of the memory device.

10. The memory controller of claim 1, wherein the endurance determination circuit is further configured to check a write counting value of one or more memory cells adjacent to the memory cells of the first page before re-writing data in the first page during the second determination operation, and
wherein the endurance determination circuit is configured to determine that the endurance of the first page has degraded in response to the write counting values of the one or more memory cells adjacent to the memory cells of the first page being equal to or less than a certain reference value.

11. The memory controller of claim 1, wherein the endurance determination circuit is further configured to check a third counting value indicating, based on the data read from the memory device, a number of second memory cells of the memory device, each of the second memory cells having an error.

12. A memory system comprising:
a memory device including a plurality of cell blocks, each cell block including a plurality of pages, and each page including a plurality of memory cells; and
a memory controller configured to:
control a memory operation on the memory device, and
perform a first counting operation for counting a number of writing operations on a first cell block of the plurality of cell blocks, a second counting operation for counting a number of cells in a first page of the first cell block in a first logic state, and a first determination operation for determining whether endurance of the first page has degraded based on results of the first counting operation and the second counting operation,
wherein the memory controller is configured to:
re-write data in the first page by using a writing current having a level lower than a level of a normal writing current in response to a result of the first determination operation on the first page having degraded endurance, and
perform a second determination operation for determining whether the endurance of the first page has degraded in response to data re-written in the first page.

13. The memory system of claim 12, wherein the memory controller is further configured to perform the second determination operation in response to an off-cell counting value of the first page resulting from the re-writing data.

14. The memory system of claim 12, wherein the memory controller is further configured to perform a third counting operation for a number of error cells in the first page, and the first determination operation for determining whether endurance of the first page has degraded based on a result of the third counting operation.

15. A method of operating a memory controller that controls a memory operation on a memory device, the method comprising:
performing a first counting indicating a number of times of accessing a first page of the memory device or a first cell block including the first page;
performing a second counting indicating a number of error cells or a number of off-cells from among memory cells of the first page, based on a result of reading data from the first page;
performing a first determination about whether endurance of the first page has degraded based on results of the first counting and the second counting;
re-writing data in the first page by using a writing current of a level that is lower than a level of a normal writing current, in response to a result of the first determination on the first page having degraded endurance;
performing a second determination about whether the endurance of the first page has degraded by using the data re-written in the first page; and
performing a wear-leveling process on the first page in response to a result of the second determination on the first page having degraded endurance.

16. The method of claim 15, wherein the performing of the first determination comprises:
determining that the endurance of the first page has degraded when a number of writing operations on the first page or the first cell block exceeds a first reference value, a number of error cells in the first page exceeds a second reference value, and a number of off-cells exceeds a third reference value.

17. The method of claim 15, wherein the performing of the second determination comprises:
determining that the endurance of the first page has degraded when a number of error cells in the first page, which is determined based on re-read data, exceeds a first reference value and a number of off-cells exceeds a second reference value.

18. The method of claim 15, wherein the performing of the wear-leveling process on the first page includes writing data of the first page having degraded endurance to a second page of the first cell block, writing data of the first page to a third page in a second cell block, or writing data of the first cell block to the second cell block.

* * * * *